US012574146B2

(12) United States Patent
Kim et al.

(10) Patent No.: US 12,574,146 B2
(45) Date of Patent: Mar. 10, 2026

(54) METHOD AND APPARATUS FOR FAST DECODING OF POLAR CODES

(71) Applicants: LG ELECTRONICS INC., Seoul (KR); KOREA ADVANCED INSTITUTE OF SCIENCE AND TECHNOLOGY, Daejeon (KR)

(72) Inventors: Bonghoe Kim, Seoul (KR); Jeongseok Ha, Daejeon (KR); Kyungmok Oh, Daejeon (KR)

(73) Assignees: LG ELECTRONICS INC., Seoul (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 18/710,084

(22) PCT Filed: Nov. 17, 2021

(86) PCT No.: PCT/KR2021/016870
§ 371 (c)(1),
(2) Date: May 14, 2024

(87) PCT Pub. No.: WO2023/090475
PCT Pub. Date: May 25, 2023

(65) Prior Publication Data
US 2025/0030501 A1    Jan. 23, 2025

(51) Int. Cl.
*H04L 1/00*        (2006.01)
*G06F 11/00*        (2006.01)
*H03M 13/00*        (2006.01)
(52) U.S. Cl.
CPC .......... *H04L 1/0052* (2013.01); *H04L 1/0057* (2013.01); *H03M 13/00* (2013.01)

(58) Field of Classification Search
CPC ........................... H04L 1/0052; H04L 1/0057
See application file for complete search history.

(56) References Cited

U.S. PATENT DOCUMENTS

| 10,193,578 B2 * | 1/2019 | Gross .................... H03M 13/09 |
| 11,133,827 B2 * | 9/2021 | Boutillon ........... H03M 13/1171 |
| 2024/0243759 A1 * | 7/2024 | Bioglio ............... H03M 13/612 |

FOREIGN PATENT DOCUMENTS

| CN | 111786744 | 10/2020 |
| KR | 10-2019-0013660 | 2/2019 |

(Continued)

OTHER PUBLICATIONS

PCT International Application No. PCT/KR2021/016870, Written Opinion and International Search Report dated Jul. 21, 2022, 6 pages.

(Continued)

*Primary Examiner* — Justin R Knapp
(74) *Attorney, Agent, or Firm* — LEE, HONG, DEGERMAN, KANG & WAIMEY

(57) ABSTRACT

The present method relates to a method by which a device receives a signal in a communication system, and an apparatus therefor, and to a method by which a reception device processes a signal in a communication system, and an apparatus therefor, the method comprising the steps of: receiving an encoded bit sequence; and decoding the encoded bit sequence in the direction from a root node to the lowest node on the basis of a binary tree structure, wherein, in the decoding step, decoding for a child node is skipped on the basis that a syndrome of a parent node satisfies a predetermined condition, and decoding for the child node is performed on the basis that the syndrome of the parent node does not satisfy the predetermined condition.

15 Claims, 17 Drawing Sheets

(56)          References Cited

FOREIGN PATENT DOCUMENTS

KR      10-2020-0132720      11/2020
KR      10-2021-0067967       6/2021

OTHER PUBLICATIONS

Huawei et al., "Early termination for Polar code," R1-1709997, 3GPP TSG RAN WG1 NR Ad-Hoc#2, Jun. 2017, 11 pages.

* cited by examiner (a)

$x_1 = \sum_{i=1}^{8} u_i$ $x_2 = u_2 \oplus u_4 \oplus u_6 \oplus u_8$ $x_3 = u_3 \oplus u_4 \oplus u_7 \oplus u_8$ $x_4 = u_4 \oplus u_8$ $x_5 = u_5 \oplus u_6 \oplus u_7 \oplus u_8$ $x_6 = u_6 \oplus u_8$ $x_7 = u_7 \oplus u_8$ $x_8 = u_8$

Figure 4:
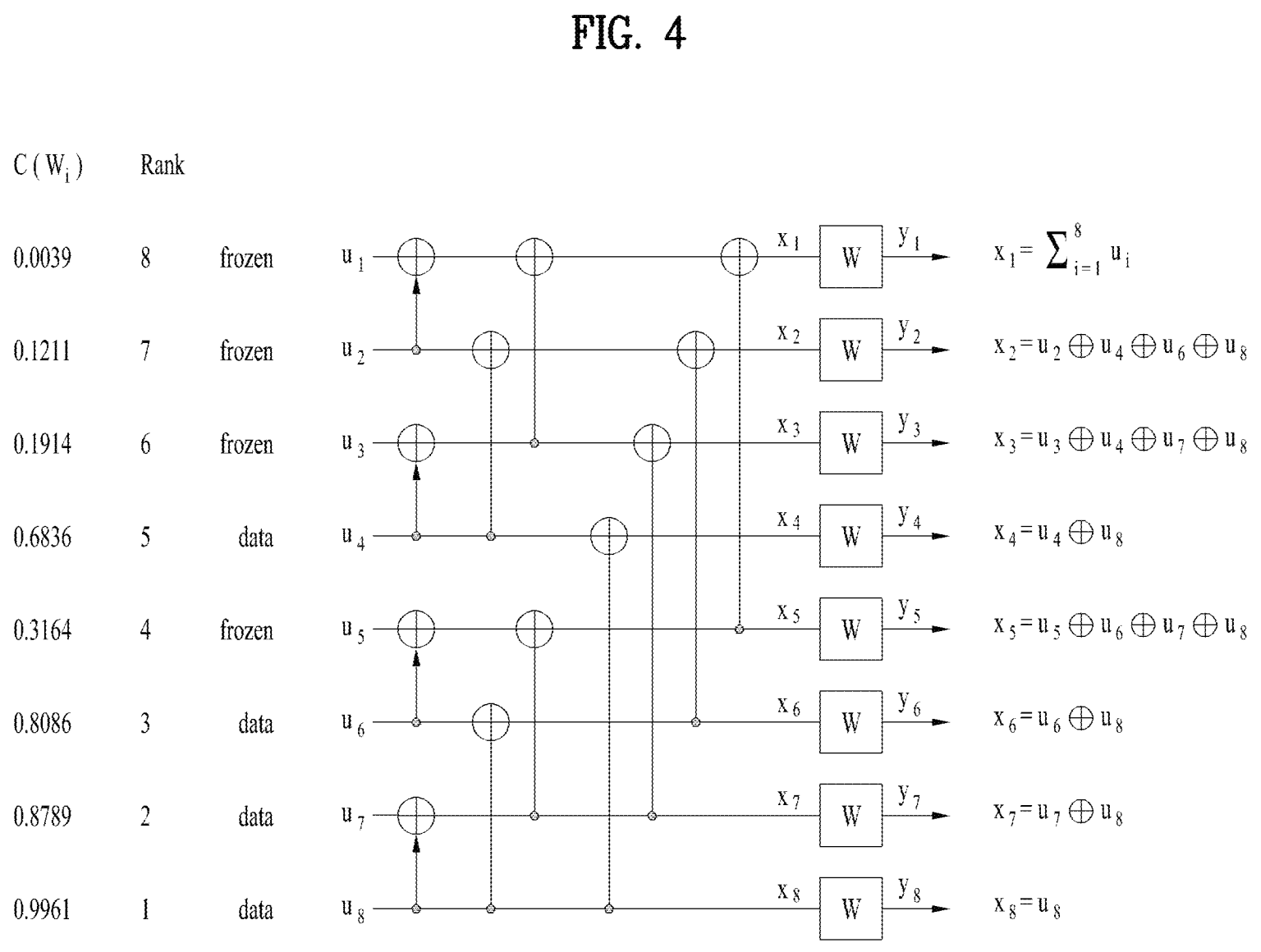

| $C(W_i)$ | Rank | | | |
|---|---|---|---|---|
| 0.0039 | 8 | frozen | $u_1$ | $x_1$ ... $y_1$ |
| 0.1211 | 7 | frozen | $u_2$ | $x_2$ ... $y_2$ |
| 0.1914 | 6 | frozen | $u_3$ | $x_3$ ... $y_3$ |
| 0.6836 | 5 | data | $u_4$ | $x_4$ ... $y_4$ |
| 0.3164 | 4 | frozen | $u_5$ | $x_5$ ... $y_5$ |
| 0.8086 | 3 | data | $u_6$ | $x_6$ ... $y_6$ |
| 0.8789 | 2 | data | $u_7$ | $x_7$ ... $y_7$ |
| 0.9961 | 1 | data | $u_8$ | $x_8$ ... $y_8$ |

W (a) Encoding procedure (b) Decoding procedure

Figure 16:
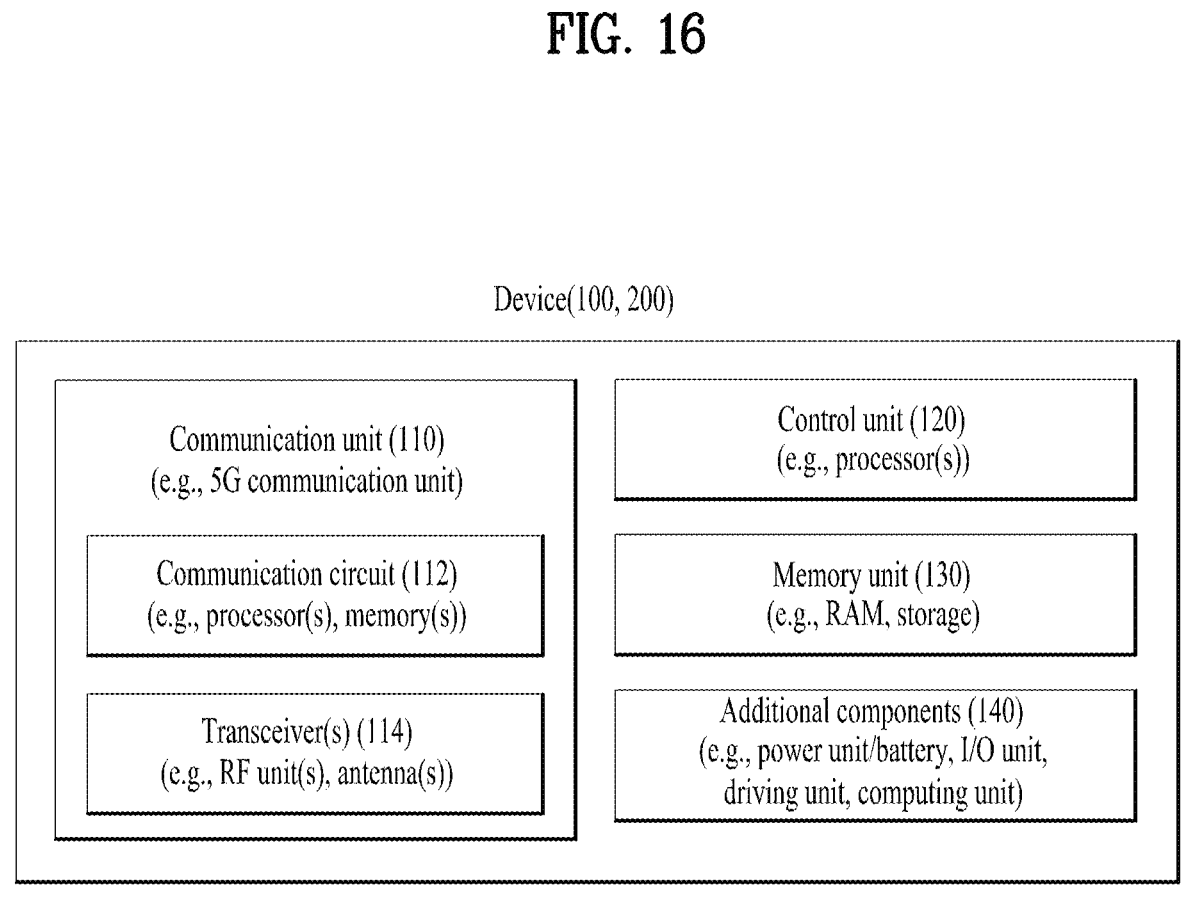

Device(100, 200)

| Communication unit (110)<br>(e.g., 5G communication unit) | Control unit (120)<br>(e.g., processor(s)) |
|---|---|
| Communication circuit (112)<br>(e.g., processor(s), memory(s)) | Memory unit (130)<br>(e.g., RAM, storage) |
| Transceiver(s) (114)<br>(e.g., RF unit(s), antenna(s)) | Additional components (140)<br>(e.g., power unit/battery, I/O unit,<br>driving unit, computing unit) |

METHOD AND APPARATUS FOR FAST DECODING OF POLAR CODES

CROSS-REFERENCE TO RELATED APPLICATION(S)

This application is the National Stage filing under 35 U.S.C. 371 of International Application No. PCT/KR2021/016870, filed on Nov. 17, 2021, the contents of which is hereby incorporated by reference herein in its entirety.

TECHNICAL FIELD

The present disclosure relates to a communication system, and more particularly, to a method and apparatus for receiving information. Specifically, the present disclosure relates to a high-speed decoding method based on polar codes and apparatus using the same.

BACKGROUND

Polar codes, which are known as channel capacity achieving codes on discrete memoryless symmetric channels, have received considerable attention as a core technology in the fifth-generation (5G) mobile communication standard. The polar codes are designed based on channel polarization, which is obtained by repeated concatenation of short kernel codes. Based on the reliability of polarized bit channels, the channel polarization allows to transmit information bits over reliable channels and configure frozen bits, which are shared by a transmitter and receiver, on less reliable channels. The polar codes are decoded by a recursive successive cancellation (SC) decoder, list SC decoder, or belief propagation decoder.

SUMMARY

The present disclosure aims to provide a method of improving the performance of variable-rate polar codes, signal transmission and reception method based thereon, and apparatus therefor.

It will be appreciated by persons skilled in the art that the objects that could be achieved with the various embodiments of the present disclosure are not limited to what has been particularly described hereinabove and the above and other objects that the various embodiments of the present disclosure could achieve will be more clearly understood from the following detailed description.

In a first aspect of the present disclosure, provided herein is a method of processing a signal by a receiving device in a communication system. The method includes: receiving an encoded bit sequence; and decoding the encoded bit sequence from a highest node to a lowest node based on a binary tree structure. Based on that a syndrome of a parent node satisfies a predetermined condition in the decoding, decoding of a child node is omitted in the decoding. Based on that the syndrome of the parent node does not satisfy the predetermined condition, the child node is decoded.

In a second aspect of the present disclosure, provided herein is a receiving device used in a communication system. The receiving device includes: at least one radio frequency (RF) unit; at least one processor; and at least one computer memory operably connected to the at least one processor and configured to, when executed, cause the at least one processor to perform operations. The operations include: receiving an encoded bit sequence; and decoding the encoded bit sequence from a highest node to a lowest node based on a binary tree structure. Based on that a syndrome of a parent node satisfies a predetermined condition in the decoding, decoding of a child node is omitted in the decoding. Based on that the syndrome of the parent node does not satisfy the predetermined condition, the child node is decoded.

In a third aspect of the present disclosure, provided herein is an apparatus used for a receiving device. The apparatus includes: at least one processor; and at least one computer memory operably connected to the at least one processor and configured to, when executed, cause the at least one processor to perform operations. The operations include: receiving an encoded bit sequence; and decoding the encoded bit sequence from a highest node to a lowest node based on a binary tree structure. Based on that a syndrome of a parent node satisfies a predetermined condition in the decoding, decoding of a child node is omitted in the decoding. Based on that the syndrome of the parent node does not satisfy the predetermined condition, the child node is decoded.

In a fourth aspect of the present disclosure, provided herein is a computer-readable storage medium including at least one computer program that, when executed, causes at least one processor to perform operations. The operations include: receiving an encoded bit sequence; and decoding the encoded bit sequence from a highest node to a lowest node based on a binary tree structure. Based on that a syndrome of a parent node satisfies a predetermined condition in the decoding, decoding of a child node is omitted in the decoding. Based on that the syndrome of the parent node does not satisfy the predetermined condition, the child node is decoded.

Preferably, the predetermined condition may include that the syndrome of the parent node is all zeros.

Preferably, the syndrome of the parent node may be determined based on the following equation:

$$\sigma = \hat{\alpha} F^{\otimes n} V^T,$$

In the above equation, $\sigma$ represents the syndrome, $\hat{\alpha}$ represents a soft decision result, $F^{\otimes n}$ represents a polar code matrix with a dimension of N*N, V represents a constraint matrix satisfying $Z * V^T = 0$, and Z represents a pre-coding matrix with a dimension of k*N.

Preferably, V may have following structure:

$$V = \begin{bmatrix} V_1 & 0 \\ V_3 & V_2 \end{bmatrix},$$

In the above equation, V1 is a constraint matrix with a dimension of $n_{f1}$*N/2, each of V2 and V3 is a constraint matrix with a dimension of $n_{f2}$*N/2, and $n_f$ represents a sum of frozen and parity lengths of child node i.

Preferably, a syndrome of child node i (where i=0, 1) is determined based on a following equation:

$$\sigma_1 = \hat{\alpha}_1 F^{\otimes n-1} V_1^T$$

$$\sigma_2 = \hat{\alpha}_2 F^{\otimes n-1} V_2^T \oplus \beta_1, F^{\otimes n-1} V_3^T,$$

In the above equation, $\sigma_i$ is the syndrome of child node i, $F^{\otimes n-1}$ is a polar code matrix with a dimension of N/2*N/2, and $\beta 1$ is a bit decision value of child node 1.

According to example(s) of the present disclosure, the performance of variable-rate polar codes may be improved. In addition, a method and apparatus using the same may also be provided.

The effects of the disclosure are not limited to those mentioned above, and other effects not mentioned will become apparent to one having ordinary knowledge in the art to which the disclosure belongs from the following detailed description of the disclosure.

BRIEF DESCRIPTION OF THE DRAWINGS

The accompanying drawings, which are incorporated as part of the detailed description to facilitate an understanding of the present disclosure, provide examples of the disclosure and, together with the detailed description, illustrate the technical ideas of the disclosure.

FIG. 4 illustrates the concept of selecting position(s) to which information bit(s) are to be allocated in polar codes.

FIGS. 14 to 17 illustrate communication systems 1 and wireless devices applicable to the present disclosure.

DETAILED DESCRIPTION

Figure 1:
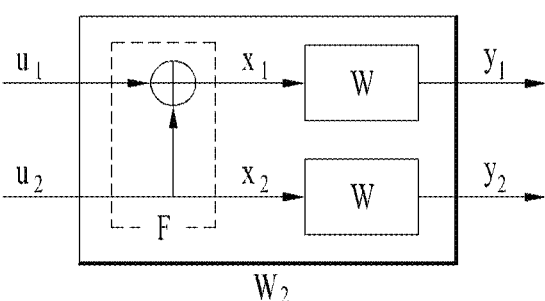
FIG. 1 is a block diagram for a polar code encoder.

Reference will now be made in detail to the exemplary examples of the present disclosure, examples of which are illustrated in the accompanying drawings. The detailed description, which will be given below with reference to the accompanying drawings, is intended to explain exemplary examples of the present disclosure, rather than to show the only examples that can be implemented according to the disclosure. The following detailed description includes specific details in order to provide a thorough understanding of the present disclosure. However, it will be apparent to those skilled in the art that the present disclosure may be practiced without such specific details.

In some instances, known structures and devices are omitted or are shown in block diagram form, focusing on important features of the structures and devices, so as not to obscure the concept of the present disclosure. The same reference numbers will be used throughout this specification to refer to the same or like parts.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE. For convenience of description, it is assumed that the present disclosure is applied to 3GPP based communication system, e.g., LTE/LTE-A, NR. However, the technical features of the present disclosure are not limited thereto. For example, although the following detailed description is given based on a mobile communication system corresponding to a 3GPP LTE/LTE-A/NR system, aspects of the present disclosure that are not specific to 3GPP LTE/LTE-A/NR are applicable to other mobile communication systems.

In examples of the present disclosure described below, the expression that a device "assumes" may mean that a subject which transmits a channel transmits the channel in accordance with the corresponding "assumption." This may also mean that a subject which receives the channel receives or decodes the channel in a form conforming to the "assumption." on the assumption that the channel has been transmitted according to the "assumption."

In the present disclosure, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present disclosure, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB, a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an gNB. Herein, for convenience of description, a base station will be referred to as a BS regardless of type or version of communication technology.

In the present disclosure, a node refers to a fixed point capable of transmitting/receiving a radio signal through communication with a UE. Various types of BSs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be a BS. For example, the node may be a radio remote head (RRH) or a radio remote unit (RRU). The RRH or RRU generally has a lower power level than a power level of a BS. Since the RRH or RRU (hereinafter, RRH/RRU) is generally connected to the BS through a dedicated line such as an optical cable, cooperative communication between RRH/RRU and the BS can be smoothly performed in comparison with cooperative communication between BSs connected by a radio line. At least one antenna is installed per node. The antenna may mean a physical antenna or mean an antenna port or a virtual antenna.

In the present disclosure, a cell refers to a prescribed geographical area to which one or more nodes provide a communication service. Accordingly, in the present disclosure, communicating with a specific cell may mean communicating with a BS or a node which provides a communication service to the specific cell. In addition, a DL/UL signal of a specific cell refers to a DL/UL signal from/to a BS or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between a BS or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region.

A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Meanwhile, the 3GPP communication standards use the concept of a cell to manage radio resources. The "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency may be the same as a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both a BS and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are defined as the UL physical channels, and a demodulation reference signal (DM RS) for a UL control/data signal and a sounding reference signal (SRS) used for UL channel measurement are defined as the UL physical signals.

In the present disclosure, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present disclosure, in particular, a time-frequency resource or RE that to or belongs to is assigned to or belongs to

7

PDCCH/PCFICH/PHICH/PDSCH/PUCCH/PUSCH/
PRACH is referred to as PDCCH/PCFICH/PHICH/PDSCH/
PUCCH/PUSCH/PRACH RE or PDCCH/PCFICH/PHICH/
PDSCH/PUCCH/PUSCH/PRACH time-frequency
resource, respectively. Therefore, in the present disclosure,
PUCCH/PUSCH/PRACH transmission of a UE is concep-
tually identical to UCI/uplink data/random access signal
transmission on PUSCH/PUCCH/PRACH, respectively. In
addition, PDCCH/PCFICH/PHICH/PDSCH transmission of
a BS is conceptually identical to downlink data/DCI transmission on PDCCH/PCFICH/PHICH/PDSCH, respectively.

For terms and technologies which are not described in
detail in the present disclosure, reference can be made to the
standard document of 3GPP LTE/LTE-A, for example,
3GPP TS 36.211, 3GPP TS 36.212, 3GPP TS 36.213, 3GPP
TS 36.321, and 3GPP TS 36.331 and the standard document
of 3GPP NR, for example, 3GPP TS 38.211. 3GPP TS
38.212, 3GPP TS 38.213, 3GPP TS 38.214, 3GPP TS 38.300
and 3GPP TS 38.331. In addition, as to polar codes and the
principle of encoding and decoding using the polar codes,
reference may be made to 'E. Arikan, "Channel Polarization:
A Method for Constructing Capacity-Achieving Codes for
Symmetric Binary-Input Memoryless Channels." in IEEE
Transactions on Information Theory, vol. 55, no. 7, pp.
3051-3073, July 2009'.

As more communication devices have demanded higher
communication capacity, there has been necessity of
enhanced mobile broadband relative to legacy radio access
technology (RAT). In addition, massive machine type com-
munication for providing various services irrespective of
time and place by connecting a plurality of devices and
objects to each other is one main issue to be considered in
future-generation communication. Further, a communica-
tion system design in which services/UEs sensitive to reli-
ability and latency are considered is under discussion. The
introduction of future-generation RAT has been discussed by
taking into consideration enhanced mobile broadband com-
munication, massive MTC, ultra-reliable and low-latency
communication (URLLC), and the like. In current 3GPP, a
study of the future-generation mobile communication system after EPC is being conducted. In the present disclosure,
the corresponding technology is referred to as a new RAT
(NR) or 5G RAT, for convenience.

NR provides higher speeds and better coverage than
current 4G. NR operates in a high frequency band and is
required to offer speeds of up to 1 Gb/s for tens of connec-
tions or tens of Mb/s for tens of thousands of connections.
To meet requirements of such an NR system, introduction of
a more evolved coding scheme than a legacy coding scheme
is under discussion. Since data communication arises in an
incomplete channel environment, channel coding plays an
important role in achieving a higher data rate for fast and
error-free communication. A selected channel code needs to
provide superior block error ratio (BLER) performance for
block lengths and code rates of a specific range. Herein,
BLER is defined as the ratio of the number of erroneous
received blocks to the total number of sent blocks. In NR,
low calculation complexity, low latency, low cost, and
higher flexibility are demanded for a coding scheme. Fur-
thermore, reduced energy per bit and improved region
efficiency are needed to support a higher data rate. Use
examples for NR networks are enhanced mobile broadband
(eMBB), massive Internet of things (IoT), and ultra-reliable
and low latency communication (URLLC), eMBB covers
Internet access with high data rates to enable rich media
applications, cloud storage and applications, and augmented
reality for entertainment. Massive IoT applications include dense sensor networks for smart homes/buildings, remote
health monitoring, and logistics tracking. URLLC covers
critical applications that demand ultra-high reliability and
low latency, such as industrial automation, driverless
vehicles, remote surgery, and smart grids.

Although many coding schemes with high capacity per-
formance at large block lengths are available, many of these
coding schemes do not consistently exhibit excellent good
performance in a wide range of block lengths and code rates.
However, turbo codes, low-density parity check (LPDC)
codes, and polar codes show promising BLER performance
in a wide range of coding rates and code lengths and hence
are considered to be used in the NR system. As demand for
various cases such as eMBB, massive IoT, and URLLC has
increased, a coding scheme providing greater channel cod-
ing efficiency than in turbo codes is needed. In addition,
increase in a maximum number of subscribers capable of
being accommodated by a channel, i.e., increase in capacity,
has been required.

Polar codes are codes providing a new framework capable
of solving problems of legacy channel codes and were
invented by Arikan at Bilkent University (reference: E.
Arikan, "Channel Polarization: A Method for Constructing
Capacity-Achieving Codes for Symmetric Binary-Input
Memoryless Channels." in IEEE Transactions on Informa-
tion Theory, vol. 55, no. 7, pp. 3051-3073, July 2009). Polar
codes are the first capacity-achieving codes with low encod-
ing and decoding complexities, which were proven math-
ematically. Polar codes outperform the turbo codes in large
block lengths while no error flow is present. Hereinafter,
channel coding using the polar codes is referred to as polar
coding.

Polar codes are known as codes capable of achieving the
capacity of a given binary discrete memoryless channel.
This can be achieved only when a block size is sufficiently
large. That is, polar codes are codes capable of achieving the
capacity of a channel if the size N of the codes infinitely
increases. Polar codes have low encoding and decoding
complexity and may be successfully decoded. Polar codes
are a sort of linear block error correction codes. Multiple
recursive concatenations are basic building blocks for the
polar codes and are bases for code construction. Physical
conversion of channels in which physical channels are
converted into virtual channels occurs and such conversion
is based on a plurality of recursive concatenations. If mul-
tiple channels are multiplied and accumulated, most of the
channels may become better or worse. The idea underlying
polar codes is to use good channels. For example, data is
sent through good channels at rate 1 and data is sent through
bad channels at rate 0. That is, through channel polarization,
channels enter a polarized state from a normal state.

FIG. 1 is a block diagram for a polar code encoder.

FIG. 1(a) illustrates a base module of a polar code,
particularly, first level channel combining for polar coding.
In FIG. 4(a), $W_2$ denotes an entire equivalent channel
obtained by combining two binary-input discrete memory-
less channels (B-DMCs), Ws. Herein, $u_1$ and $u_2$ are binary-
input source bits and $y_1$ and $y_2$ are output coded bits.
Channel combining is a procedure of concatenating the
B-DMCs in parallel.

FIG. 1(b) illustrates a base matrix F for the base module.
The binary-input source bits $u_1$ and $u_2$ input to the base
matrix F and the output coded bits $x_1$ and $x_2$ of the base
matrix F have the following relationship.

$$[u_1 \ u_2]\begin{bmatrix} 1 & 0 \\ 1 & 1 \end{bmatrix} = [x_1 \ x_2] \qquad \text{Equation 1}$$

The channel $W_2$ may achieve symmetric capacity I(W) which is a highest rate. In the B-DMC W, symmetric capacity is an important parameter which is used to measure a rate and is a highest rate at which reliable communication can occur over the channel W. The B-DMC may be defined as follows.

$$I(W) = \sum_{y \in Y} \sum_{x \in X} 1/2 W(y \mid x) \log \frac{w(y \mid x)}{1/2w(y \mid 0) + 1/2w(y \mid 1)} \qquad \text{Equation 2}$$

It is possible to synthesize or create a second set of N binary input channels out of N independent copies of a given B-DMC W and the channels have the properties $\{W_N^{(i)}: 1 \le i \le N\}$. If N increases, there is a tendency for a part of the channels to have capacity approximating to 1 and for the remaining channels to have capacity approximating to 0. This is called channel polarization. In other words, channel polarization is a process of creating a second set of N channels $\{W_N^{(i)}: 1 \le i \le N\}$ using N independent copies of a given B-DMC W. The effect of channel polarization means that, when N increases, all symmetric capacity terms $\{I(W_N^{(i)})\}$ tend towards 0 or 1 for all except a vanishing fraction of indexes i. In other words, the concept behind channel polarization in the polar codes is transforming N copies (i.e., N transmissions) of a channel having a symmetric capacity of I(W) (e.g., additive white Gaussian noise channel) into extreme channels of capacity close to 1 or 0. Among the N channels, an I(W) fraction will be perfect channels and an 1-I(W) fraction will be completely noise channels. Then, information bits are transmitted only through good channels and bits input to the other channels are frozen to 1 or 0. The amount of channel polarization increases along with a block length. Channel polarization consists of two phases: channel combining phase and channel splitting phase.

Figure 2:
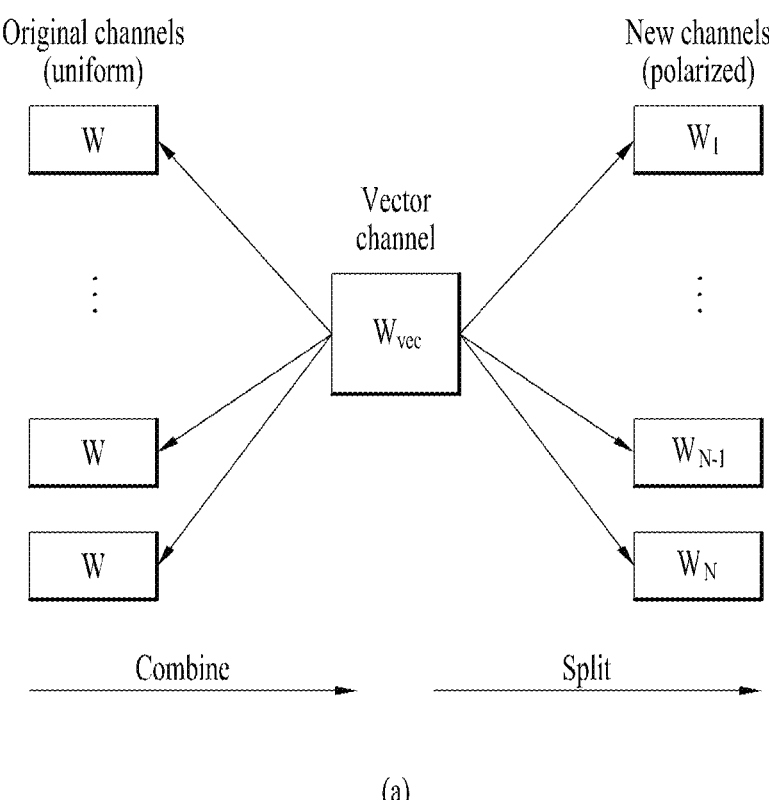
FIG. 2 illustrates the concept of channel combining and channel splitting for channel polarization.
Figure 2:
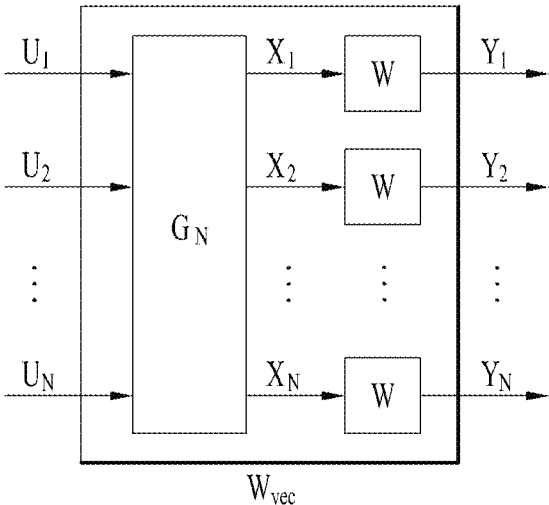

FIG. 2 illustrates the concept of channel combining and channel splitting for channel polarization. As illustrated in FIG. 2, when N copies of an original channel W are properly combined to create a vector channel $W_{vec}$ and then are split into new polarized channels, the new polarized channels are categorized into channels having capacity C(W)=1 and channels having C(W)=0 if N is sufficiently large. In this case, since bits passing through the channels having the channel capacity C(W))=1 are transmitted without error, it is better to transmit information bits therethrough and, since bits passing through the channels having capacity C(W)=0 cannot transport information, it is better to transport frozen bits, which are meaningless bits, therethrough.

Referring to FIG. 2, copies of a given B-DMC W are combined in a recursive manner to output a vector channel $W_{vec}$ given by $X_N \to Y_N$, where $N=2^n$ and n is an integer equal to or greater than 0. Recursion always begins at the 0th level and $W_1$=W. If n is 1 (n=1), this means the first level of recursion in which two independent copies of $W_1$ are combined. If the above two copies are combined, a channel $W_2$: $X_2 \to Y_2$ is obtained. A transitional probability of this new channel $W_2$ may be represented by the following equation.

$$W_2(y_1, y_2 \mid u_1, u_2) = W)y_1 \mid u_1 \oplus u_2)W(y_1 \mid u_2) \qquad \text{Equation 3}$$

If the channel $W_2$ is obtained, two copies of the channel $W_2$ are combined to obtain a single copy of a channel $W_4$. Such recursion may be represented by $W_4$: $X_4 \to Y_4$ having the following transitional probability.

$$W_4(y_1^4 \mid u_1^4) = W_2(y_1^2 \mid u_1 \oplus u_2, u_3 \oplus u_4)W_2(y_3^4 \mid u_2, u_4) \qquad \text{Equation 4}$$

In FIG. 2, $G_N$ is a size-N generator matrix. $G_2$ corresponds to the base matrix F illustrated in FIG. 1(b). $G_4$ may be represented by the following matrix.

$$G_4 = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \begin{bmatrix} 1 & 0 \\ 1 & 1 \end{bmatrix}^{\otimes 2} = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \qquad \text{Equation 5}$$

Herein, $\otimes$ denotes the Kronecker product, $A^{\otimes n} = A \otimes A^{\otimes (n-1)}$ for all $n \ge 1$, and $A^{\otimes 0} = 1$.

The relationship between input $u_1^N$ to $G_N$ and output $x_1^N$ of $G_N$ of FIG. 2(b) may be represented as $x_1^N = u_1^N G_N$, where $x_1^N = \{x_1, \ldots, X_N\}$, $U_1^N = \{u_1, \ldots, u_N\}$ When N B-DMCs are combined, each B-DMC may be expressed in a recursive manner. That is, $G_N$ may be indicated by the following equation.

$$G_N = B_N F^{Wn} \qquad \text{Equation 6}$$

Herein, $N=2^n$, $n \ge 1$, $F^{\otimes n} = F \otimes F^{\otimes (n-1)}$, and $F^{\otimes 0} = 1$. $B_N$ is a permutation matrix known as a bit-reversal operation and $B_N = R_N(I_2 \otimes B_{N/2})$ and may be recursively computed. $I_2$ is a 2-dimensional identity matrix and this recursion is initialized to $B_2 = I_2$. $R_N$ is a bit-reversal interleaver and is used to map an input $s_1^N = \{s_1, \ldots, s_N\}$ to an output $x_1^N = \{s_1, s_3, \ldots, s_{N-1}, s_2, \ldots, s_N\}$. The bit-reversal interleaver may not be included in a transmitting side. The relationship of Equation is illustrated in FIG. 3.

Figure 3:
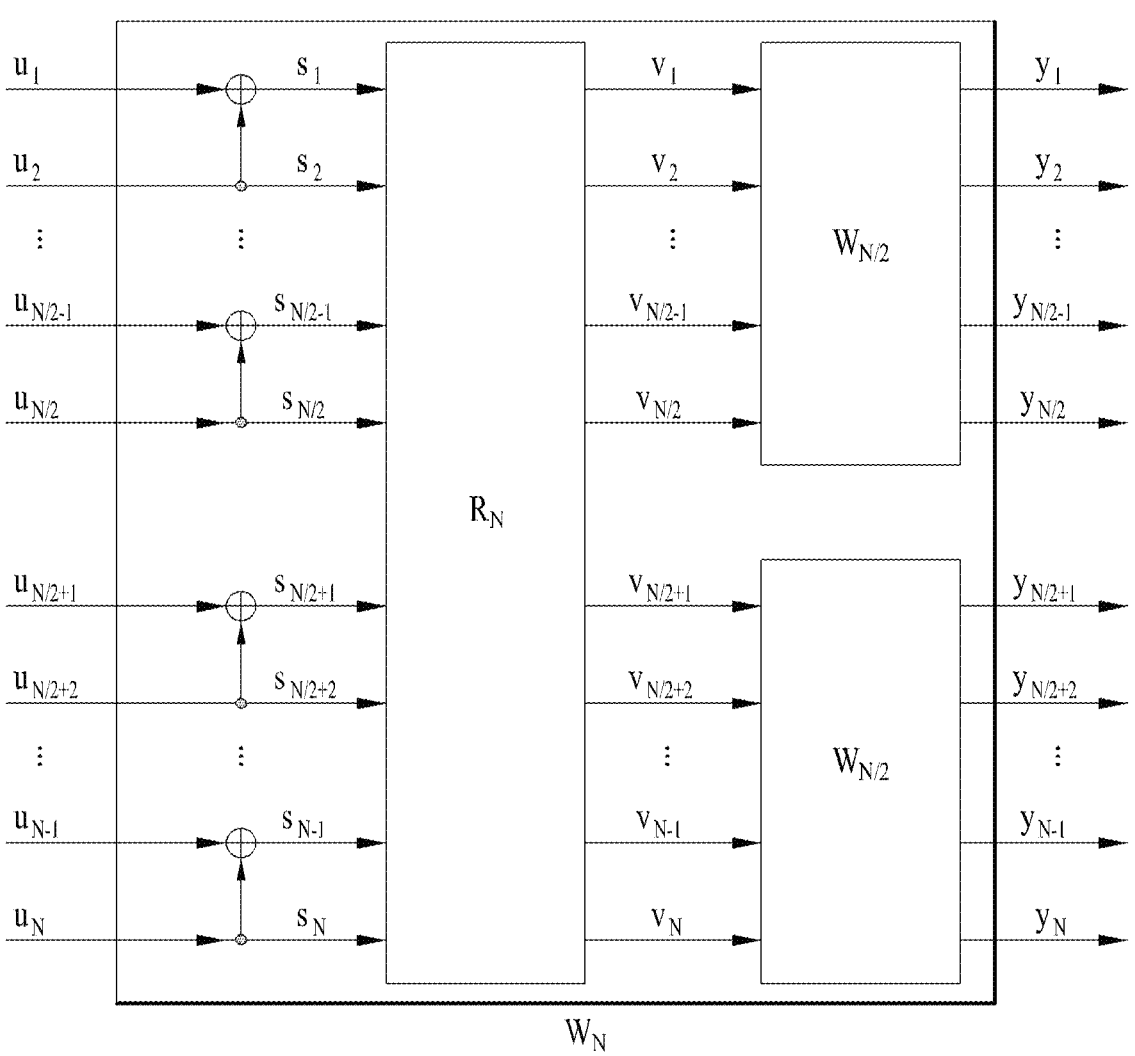
FIG. 3 illustrates N-th level channel combining for a polar code.

FIG. 3 illustrates N-th level channel combining for a polar code.

A process of defining an equivalent channel for specific input after combining N B-DMCs Ws is called channel splitting. Channel splitting may be represented as a channel transition probability indicated by the following equation.

$$W_N^i\left(y_1^N, u_1^{i-1} \mid u_i\right) = \sum_{u_{i+1}^N} \frac{1}{2^{N-1}} W_N\left(y_1^N \mid u_1^N\right) \qquad \text{Equation 7}$$

Channel polarization has the following characteristics:
>Conservation: $C(W^-)+C(W^+)=2C(W)$,
>Extremization: $C(W^-) \le C(W) \le C(W^+)$.

When channel combining and channel splitting are performed, the following theorem may be obtained.

* Theorem: For any B-DMC W, channels $\{W_N^{(i)}\}$ are polarized in the following sense. For any fixed $\delta \in \{0,1\}$, as N goes to infinity through powers of 2, the fraction of indexes $i \in \{1, \ldots, N\}$ for channel capacity $I(W_N^{(i)}) \in (1-\delta,1]$ goes to I(W) and the faction of i for channel capacity $I(W_N^{(i)}) \in [0,\delta)$ goes to 1-I(W). Hence, if $N \to \infty$, then channels are perfectly noisy or are polarized free of noise. These channels can be accurately recognized by the transmitting side. Therefore, bad channels are fixed and non-fixed bits may be transmitted on good channels.

That is, if the size N of polar codes is infinite, a channel has much noise or is free of noise, with respect to a specific input bit. This has the same meaning that the capacity of an equivalent channel for a specific input bit is divided into 0 or I(W).

Inputs of a polar encoder are divided into bit channels to which information data is mapped and bit channels to which the information data is not mapped. As described earlier, according to the theorem of the polar code, if a codeword of the polar code goes to infinity, the input bit channels may be classified into noiseless channels and noise channels. Therefore, if information is allocated to the noiseless bit channels, channel capacity may be obtained. However, in actuality, a codeword of an infinite length cannot be configured, reliabilities of the input bit channels are calculated and data bits are allocated to the input bit channels in order of reliabilities. In the present disclosure, bit channels to which data bits are allocated are referred to as good bit channels. The good bit channels may be input bit channels to which the data bits are mapped. Bit channels to which data is not mapped are referred to as frozen bit channels. A known value (e.g., 0) is input to the frozen bit channels and then encoding is performed. Any values which are known to the transmitting side and the receiving side may be mapped to the frozen bit channels. When puncturing or repetition is performed, information about the good bit channels may be used. For example, positions of codeword bits (i.e., output bits) corresponding to positions of input bits to which information bits are not allocated may be punctured.

FIG. 4 illustrates the concept of selecting position(s) to which information bit(s) are to be allocated in polar codes.

In FIG. 4, it is assumed that the size N of mother codes is 8, i.e., the size N of polar codes is 8, and a code rate is ½.

Figure 8:
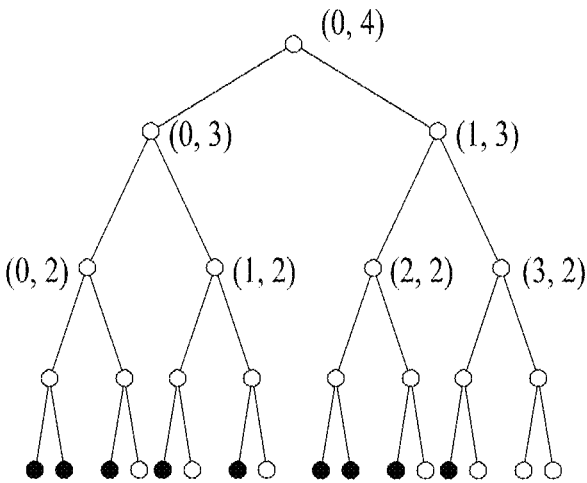

In FIG. 4, C(W$_i$) denotes the capacity of a channel W$_i$ and corresponds to the reliability of channels that input bits of a polar code experience. When channel capacities corresponding to input bit positions of the polar code are as illustrated in FIG. 8, reliabilities of the input bit positions are ranked as illustrated in FIG. 4 To transmit data at a code rate of ½, a transmitting device allocates 4 bits constituting the data to 4 input bit positions having high channel capacities among 8 input bit positions (i.e., input bit positions denoted as U$_4$, U$_6$, U$_7$, and U$_4$ among input bit positions U$_1$ to U$_8$ of FIG. 4) and freezes the other input bit positions. A generator matrix G$_8$ corresponding to the polar code of FIG. 4 is as follows. The generator matrix G$_8$ may be acquired based on Equation 6.

$$G_8 = \begin{vmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{vmatrix} \qquad \text{Equation 8}$$

The input bit positions denoted as U$_1$ to U$_8$ of FIG. 4 correspond one by one to rows from the lowest row to the highest row of G$_8$. Referring to FIG. 4, it may be appreciated that the input bit corresponding to U$_8$ affects all output coded bits. On the other hand, it may be appreciated that the input bit corresponding to U$_1$ affects only Y$_1$ among the output coded bits. Referring to Equation 12, when binary-input source bits U$_1$ to U$_8$ are multiplied by G$_8$, a row in which the input bits appear at all output bits is the lowest row [1, 1, 1, 1, 1, 1, 1, 1] in which all elements are 1, among rows of G$_8$. Meanwhile, a row in which the binary-input source bits appears at only one output bit is a row in which one element is 1 among the rows of G$_8$, i.e., a row [1, 0, 0, 0, 0, 0, 0, 0] in which a row weight is 1. Similarly, it may be appreciated that a row in which a row weight is 2 reflects input bits corresponding to the row in two output bits. Referring to FIG. 8 and Equation 12, U$_1$ to U$_8$ correspond one by one to the rows of G$_8$ and bit indexes for distinguishing between input positions of U$_1$ to U$_8$, i.e., bit indexes for distinguishing between the input positions, may be assigned to the rows of G$_8$.

Hereinafter, for Polar codes, it may be assumed that bit indexes from 0 to N−1 are sequentially allocated to rows of G$_N$ starting from the highest row having the smallest row weight with respect to N input bits. For example, referring to FIG. 8, a bit index 0 is allocated to the input position of U$_1$, i.e., the first row of G$_8$ and a bit index 7 is allocated to the input position of U$_8$, i.e., the last row of G$_8$. However, since the bit indexes are used to indicate input positions of the polar code, a scheme different from the above allocation scheme may be used. For example, bit indexes from 0 to N−1 may be allocated staring from the lowest row having the largest row weight.

In the case of output bit indexes, as illustrated in FIG. 4 and Equation 8, it may be assumed that bit indexes from 0 to N−1 or bit indexes from 1 to N are assigned to columns from the first column having the largest column weight to the last column having the smallest column weight among columns of G$_N$.

In Polar codes, setting of information bits and frozen bits is one of the most important elements in the configuration and performance of the polar code. That is, determination of ranks of input bit positions may be an important element in the performance and configuration of the polar code. For Polar codes, bit indexes may distinguish input or output positions of the polar code. In the present disclosure, a sequence obtained by enumerating reliabilities of bit positions in ascending or descending order are referred to as a bit index sequence. That is, the bit index sequence represents reliabilities of input or output bit positions of the polar code in ascending or descending order. A transmitting device inputs information bits to input bits having high reliabilities based on the input bit index sequence and performs encoding using the polar code. A receiving device may discern input positions to which information bits are allocated or input positions to which frozen bits are allocated, using the same or corresponding input bit index sequence. That is, the receiving device may perform polar decoding using an input bit index sequence which is identical to or corresponds to an input bit sequence used by the transmitting device and using a corresponding polar code. In the following description, it may be assumed that an input bit sequence is predetermined so that information bit(s) may be allocated to input bit position(s) having high reliabilities.

EMBODIMENTS

Figure 5:
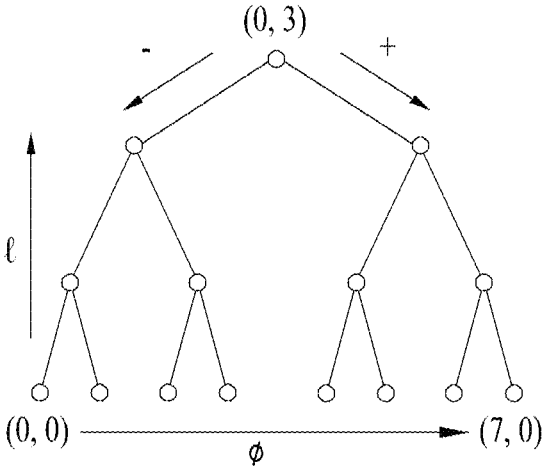
FIG. 5 illustrates a binary tree structure for decoding.

The decoding method of polar codes includes successive cancellation (SC) decoding. The SC decoding process may involve computing soft and hard decision information in a binary tree structure as illustrated in FIG. 5. In a binary tree, each node may be identified by a pair ($\phi$, $\ell$), where $\phi$ represents the node number within a layer/level, and $\ell$ represents the layer/level of a node. Each node stores soft decision information $\alpha_{\phi,\ell}$ (e.g., log-likelihood ratio (LLR))

and hard decision bit information $\beta_{\phi,\ell}$. The LLR received over a channel $L_y$, is set to the LLR of the highest node ($\alpha_{0,n}=L_y$, where n represents the layer/level of the root node). Thereafter, soft decision information (LLR) from the highest node to the lowest node may be calculated. Once the LLR of the lowest node is calculated, hard decision bit information is obtained based on the LLR. Decoding is performed by updating the LLR back to a higher node. As a result of this process, complexity and latency increase since soft and hard decision information need to be computed for all nodes.

Figure 6:
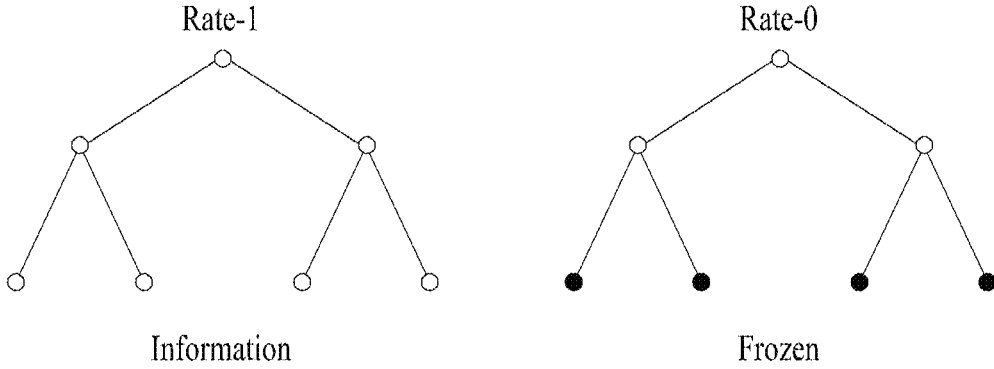
FIG. 6 illustrates a node structure used in conventional high-speed decoding.
Figure 6:
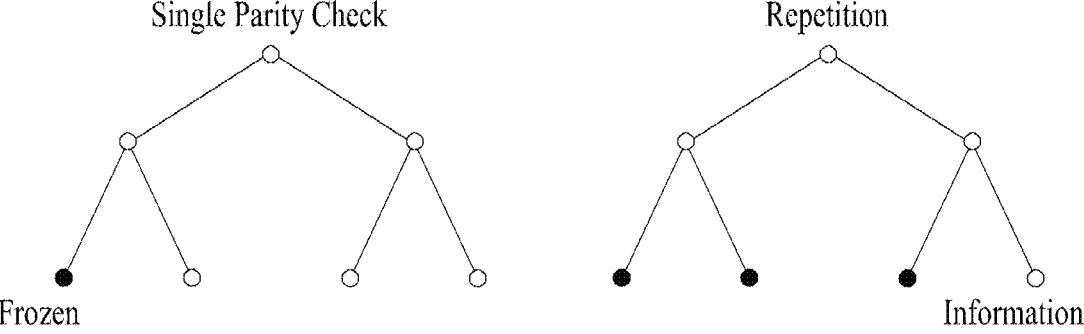

To address this issue, a method of skipping the calculation of LLR information for lower nodes and completing decoding at higher nodes if the nodes satisfy a specific structure has been proposed. Referring to FIG. 6, if the lower nodes of a node are all information bits, rate-1 decoding may be performed. If the lower nodes are all frozen bits, rate-0 decoding may be performed. If there is a frozen bit positioned at the leftmost child node, single parity check decoding may be performed. If there is an information bit positioned at the rightmost child node, repetition decoding may be performed. Since the decoding complexity of rate-1, rate-0, single parity check, and repetition codes are simpler than exploring the remaining nodes according to conventional methods, the complexity may be reduced.

However, for concatenated polar codes designed to enhance the finite-length performance of polar codes, particularly, for pre-coded polar codes based on algebraic codes, the benefits of the above-described high-speed decoding algorithm are significantly reduced. In the case of algebraic code-based polar codes, the positions of frozen or information bits are not fixed to the leftmost or rightmost positions but may be placed at arbitrary locations, unlike conventional polar codes. Thus, the frequency of occurrences of such a structure may be sharply reduced.

To address this issue, the present disclosure proposes a high-speed decoding method capable of achieving complexity benefits regardless of the node structure. Specifically, the present disclosure proposes a high-speed decoding method based on syndrome verification. According to the high-speed decoding algorithm of the present disclosure, a syndrome verification process may be performed for each node, and if the syndrome is satisfied, the decoding process for lower nodes may be skipped. Since the syndrome calculation process is carried out recursively, additional complexity is minimized. In addition, unlike existing algorithms, complexity benefits may be obtained regardless of the frequency of occurrence of repetition and single parity check nodes. Therefore, the high-speed decoding method proposed in the present disclosure is applicable to algebraic polar codes as well.

Figure 7:
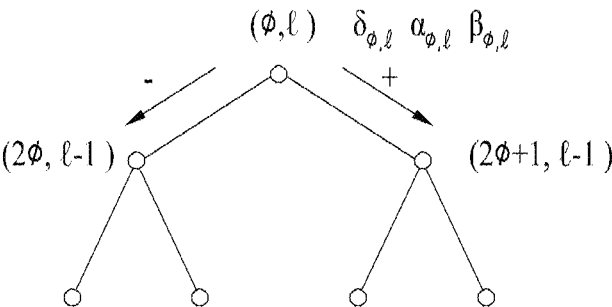
FIGS. 7 and 8 illustrate a high-speed decoding method according to an example of the present disclosure.

FIG. 7 illustrates node information for a high-speed decoding method based on syndrome verification. Referring to FIG. 7, each node stores additional syndrome information $\sigma_{\phi,\ell}$ in addition to conventional information $\alpha_{\phi,\ell}$ and $\beta_{\phi,\ell}$. Each information may be defined as follows.

Soft decision vector: $\alpha_{\phi,\ell}=[\alpha_{\phi,\ell}(1), \alpha_{\phi,\ell}(1), \ldots, \alpha_{\phi,\ell}(2^\ell)]$ Hard decision bit vector: $\beta_{\phi,\ell}=[\beta_{\phi,\ell}(1), \beta_{\phi,\ell}(1), \ldots, \beta_{\phi,\ell}(2^\ell)]$ Syndrome vector: $\sigma_{\phi,\ell}=[\sigma_{\phi,\ell}(1), \sigma_{\phi,\ell}(1), \ldots, \sigma_{\phi,\ell}(n_f(\phi, \ell))]$ Here, $n_f(\phi, \ell)$ represents the number of frozen bits within the subtree.

Hereinafter, the high-speed decoding method based on syndrome verification will be described in detail. For convenience, algebraic polar codes are used. However, it should be noted that the algebraic polar codes are merely an example, and the application scope of the present disclosure is not limited to the algebraic polar codes.

First, for message m of length k, it is assumed that codeword c of length N ($=2^n$) is obtained as follows.

$$c = mZF^{\otimes n} \qquad \text{Equation 9}$$

In Equation 9, matrix Z represents a precoding matrix with a dimension of k*N and determine the positions of information bits and frozen bits (including parity bits) inputted into polar codes. $F^{\otimes n}$ represents an N*N dimensional polar code matrix.

In this case, the highest syndrome $\sigma_{0,n}$ may be determined according to Equation 10.

$$\sigma_{0,n} = \hat{\alpha}_{0,n}F^{\otimes n}V^T \qquad \text{Equation 10}$$

In Equation 10, $\hat{\alpha}_{0,n}$ represents the hard decision result of $\alpha_{o,n}$. The hard decision result may be determined according to Equation 11.

$$\hat{\alpha}_{0,n}(i) = \begin{cases} 1, & \alpha_{o,n}(i) < 0 \\ 0, & \alpha_{o,n}(i) \geq 0 \end{cases} (i = 1, 2, \ldots, 2^n) \qquad \text{Equation 11}$$

In addition, matrix V is a constraint matrix generated from algebraic codes and satisfies $ZV^T=0$. In the case of non-algebraic polar codes, matrix V is omitted.

After the syndrome is calculated, it is checked whether the following high-speed decoding conditions are satisfied. If the high-speed decoding conditions are met, high-speed decoding is performed to determine the values of $\beta_{\phi,\ell}$.

1. If the node is rate-1, $\beta_{\phi,\ell}=\hat{\alpha}_{\phi,\ell}$
2. If the node is rate-0, $\beta_{\phi,\ell}=0$
3. If the syndrome is satisfied, ($\sigma_{\phi,\ell}=0$) and $\beta_{\phi,\ell}=\hat{\alpha}_{\phi,\ell}$ If none of the three conditions are satisfied, the soft decision information (e.g., LLR) and syndrome, $\alpha_{2\phi,\ell-1}$ and $\alpha_{2\phi,\ell-1}$ of a child node in the (−) direction may be calculated.

In this case, $\alpha_{2\phi,\ell-1}$ and $\alpha_{2\phi,\ell-1}$ may be determined according to Equation 12.

$$\alpha_{2\phi,\ell-1} = \alpha_{\phi,\ell}(1:2^{\ell-2}) \boxplus \alpha_{\phi,\ell}(2^{\ell-2}+1:2^{\ell-1}) \qquad \text{Equation 12}$$
$$\sigma_{2\phi,\ell-1} = \sigma_{\phi,\ell}(1:n_f(2\phi, \ell-1))$$

In Equation 12, $x \boxplus y$ is 2 atanh(tanh(x)tanh(y)), which may be approximated to sgn(x)sgn(y) min(|x|, |y|) to reduce complexity, where x:y denotes [x, . . . , y].

Referring to Equation 12, $\sigma_{2\phi,\ell-1}$ may be obtained directly by taking the first $n_f(2\phi, \ell-1)$ nodes in the syndrome of the parent. Here, $n_f(2\phi, \ell-1)$ represents the total number of frozen/parity bits within the subtree of node ($2\phi, \ell-1$).

If decoding is successful for a child node in the (−) direction, decoding proceeds in the (−) direction. Consequently, the soft decision information (e.g., LLR) and syndrome, $\alpha_{2\phi+1,\ell-1}$ and $\sigma_{2\phi+1,\ell-1}$ of a child node in the (+) direction may be calculated.

Here, $\alpha_{2\phi+1,\ell-1}$ and $\sigma_{2\phi+1,\ell-1}$ may be determined according to Equation 13.

$$\alpha_{2\phi+1,\ell-1} = \alpha_{\phi,\ell}\left(1:2^{\ell-2}\right) + (-1)^{\beta_{2\phi,\ell-1}}\alpha_{\phi,\ell}\left(2^{\ell-2}+1:2^{\ell-1}\right) \quad \text{Equation 13}$$

$$\sigma_{2\phi+1,\ell-1} = \sigma_{\phi,\ell}\left(n_f(2\phi,\ \ell-1)+1:2^\ell\right) \oplus \delta\tilde{V}_{\phi,\ell}^T \oplus (\mu\cdot\delta)\tilde{V}'^T_{\phi,\ell}$$

Here, $\delta$, $\tilde{V}_{\phi,\ell}{}^T$, $\tilde{V}'_{\phi,\ell}{}^T$, and $\mu$ are defined as follows. The operation of a·b represents the bitwise AND operator.

$$\delta = \hat{\alpha}_{2\phi,\ell-1} \oplus \beta_{2\phi,\ell-1} \quad \text{Equation 14}$$

$$\tilde{V}_{\phi,\ell}^T = F^{\otimes\ell}V\left(r,\left[\phi 2^\ell+1:(\phi+1)2^\ell\right]\right)^T$$

$$\tilde{V}'^T_{\phi,\ell} = F^{\otimes\ell}V\left(r,\left[(\phi-1)2^\ell+1:\phi 2^\ell\right]\right)^T$$

$$\mu = \left[\mu_1, \mu_2 \ \ldots\ , \mu_2^{\ell-1}\right], \mu_i = \begin{cases} 1, & |\alpha_{\phi,\ell}(2^\ell+i)| \geq |\alpha_{\phi,\ell}(i)| \\ 0, & \text{otherwise} \end{cases}$$

In Equation 14, $V(r,c)$ represents a submatrix generated from matrix V by selecting a row index $r=[r_1, r_2, \ldots, r_{n1}]$ and a column index $c=[c_1, c_2, \ldots, c_{n2}]$, where V has the following structure.

$$V = \begin{bmatrix} V_1 & 0 \\ V_3 & V_2 \end{bmatrix} \quad \text{Equation 15}$$

In Equation 15, V1 is a constraint matrix with a dimensions of $n_{f1}$*N/2, and V2 and V3 are constraint matrices with a dimensions of $n_{f2}$*N/2, where $n_{fi}$ represents the sum of the frozen/parity lengths (i.e., the number of bits) of child nodes.

Here, $F^{\otimes n}=F\otimes F^{\otimes (n-1)}$, where $F^{\otimes 0}=1$.

$$F^{\otimes n} = \begin{bmatrix} F^{\otimes n-1} & 0 \\ F^{\otimes n-1} & F^{\otimes n-1} \end{bmatrix} \quad \text{Equation 16}$$

When computing the syndrome of the child node in the (+) direction (Equation 13), the calculation complexity of $\delta\tilde{V}_{\phi,\ell}{}^T$ and $(\mu\cdot\delta)\tilde{V}'_{\phi,\ell}{}^T$ becomes simpler due to the smaller number of 1s in vector $\delta$.

FIG. 8 illustrates an exemplary high-speed decoding method according to the present disclosure. FIG. 8 is an example of high-speed decoding of an extended Bose-Chaudhuri-Hocquengham (eBCH) code of (16, 7). It is assumed that a transmitted codeword is a zero vector. In addition, a vector received by a decoder when passing through an AWGN channel after BPSK modulation is assumed as follows.

$$y = \begin{cases} 1.22, 0.97, -0.41, 1.47 \\ 1.28, 0.37, 2.13, 1.94 \\ 0.48, 1.89, -0.47, 0.50, \\ 0.22, 0.87, 1.31, 0.78 \end{cases} \quad \text{Equation 17}$$

An SC decoder performs decoding on the tree shown in FIG. 8, and decoding starts from the highest node, node (0, 4). Initially, node (0, 4) stores y from a channel in memory $\alpha_{0,4}$ ($\alpha_{0,4}$=y). In the first step, syndrome $\sigma$ is calculated from reliability $\alpha_{0,4}$. The syndrome may be obtained by multiplying the hard decision value of $\alpha_{0,4}$ and the parity-check matrix of the (16, 7) eBCH code. In the hard decision, elements greater than 0 are mapped to 0, and elements less than 0 are mapped to 1. The parity-check matrix of eBCH codes is as follows.

$$\begin{bmatrix} 1 & 1 & 1 & 1 & 1 & 1 & 1 & 1 & 1 & 1 & 1 & 1 & 1 & 1 & 1 & 1 \\ 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 \\ 0 & 0 & 0 & 0 & 1 & 1 & 1 & 1 & 0 & 0 & 0 & 0 & 1 & 1 & 1 & 1 \\ 0 & 0 & 0 & 1 & 0 & 0 & 1 & 0 & 0 & 0 & 0 & 1 & 0 & 0 & 1 & 0 \\ 0 & 0 & 0 & 0 & 0 & 0 & 0 & 0 & 1 & 1 & 1 & 1 & 1 & 1 & 1 & 1 \\ 0 & 0 & 0 & 0 & 0 & 1 & 0 & 1 & 0 & 1 & 0 & 1 & 0 & 0 & 0 & 0 \\ 0 & 0 & 0 & 1 & 0 & 1 & 0 & 0 & 0 & 0 & 1 & 0 & 0 & 1 & 1 & 1 \\ 0 & 0 & 0 & 1 & 0 & 1 & 0 & 0 & 0 & 0 & 0 & 1 & 1 & 0 & 1 & 1 \end{bmatrix} \quad \text{Equation 18}$$

The syndrome is computed as follows.

$$\sigma = \hat{\alpha}_{0,4}H^T = \quad \text{Equation 19}$$

$$\{0\ 0\ 1\ 0\ 0\ 0\ 0\ 0\ 0\ 0\ 1\ 0\ 0\ 0\ 0\ 0\}H^T =$$

$$\{0\ 0\ 0\ 0\ 0\ 1\ 0\ 1\ 0\}$$

If $\sigma$ is a zero vector, decoding is terminated, and $\hat{\alpha}_{0,4}$ is output as a decoding bit. In the example, since the syndrome is not zero, decoding proceeds by moving to a left child node of (0, 3). For the left child node, $\alpha_{0,3}$ may be calculated as follows.

$$\alpha_{0,3} = \alpha'_{0,4} \boxplus \alpha''_{0,4} \quad \text{Equation 20}$$

In Equation 20, $\alpha_{0,4}'$ means the front half of $\alpha_{0,4}$, and $\alpha_{0,4}''$ means the back half of $\alpha_{0,4}$. Since $\alpha_{0,4}$=y, $\alpha_{0,4}'$ and $\alpha_{0,4}''$ are given as follows.

$$\alpha'_{0,4} = \{1.22, 0.97, -0.41, 1.47, 1.28, 0.37, 2.13, 1.94\} \quad \text{Equation 21}$$

$$\alpha''_{0,4} = \{0.48, 1.89, -0.47, 0.50, 0.22, 0.87, 1.31, 0.78\}$$

The operator of a $\boxplus$ b refers to calculating sign(a)sign(b) min(|a|, |b|) for each bit, where sign(a) means the sign of a. Based on the above example, $\alpha_{0,3}$ is calculated as follows.

$$\alpha_{0,3} = \quad \text{Equation 22}$$

$$\{0.4800\ 0.9700\ 0.4100\ 0.5000\ 0.2200\ 0.3700\ 1.3100\ 0.7800\}$$

The syndrome at node (0, 3) may be calculated as follows.

$$\sigma_{0,3} = \hat{\alpha}_{0,3}H_{0,3}^T \quad \text{Equation 23}$$

Referring to Equation 22, a matrix multiplication operation is required. However, since the matrix multiplication operation is complex, a method of obtaining the syndrome without performing the matrix multiplication operation will be described. It is assumed that among the child nodes of node $(\phi, \ell)$, the number of nodes corresponding to F and P (black nodes in FIG. 8) is $n_f(\phi, \ell)$ and the syndrome of the parent node is $\sigma=\{\sigma_1, \sigma_2, \ldots, \sigma_{n_f(0,4)}\}$. In this case, left child nodes may be obtained directly by taking the first $n_f(0, 3)$ nodes in the syndrome of the parent. In other words, since $n_f(0, 4)$ is 9 and $n_f(0, 3)$ is 5, $\sigma_{0,3}=\{0\ 0\ 0\ 0\ 0\}$ may be obtained by taking first 5 elements among 9 elements.

$$\sigma = \left\{ \underbrace{0\ 0\ 0\ 0\ 0}_{\sigma_{0,3}}\ 1\ 0\ 1\ 0 \right\} \qquad \text{Equation 24}$$

After obtaining the syndrome of node (0, 3), the decoder may determine whether high-speed decoding is allowed. In the example, since all the syndromes are zero, the decoding value of the corresponding node may be obtained immediately without decoding lower nodes $(\beta_{0,3}=\hat{\alpha}_{0,3})$. Thereafter, $\alpha_{1,3}$ and $\sigma_{1,3}$ are calculated by moving to a right child node of (1, 3). For the left child node, $\alpha_{0,3}$ may be calculated as follows.

The reliability of the right child node may be determined according to Equation 25.

$$\alpha_{1,3} = \alpha''_{0,4} + (-1)^{\beta_{0,3}} \alpha'_{0,4} \qquad \text{Equation 25}$$

$\alpha_{1,3} = \{1.7000\ 2.8600\ -$ $\qquad 0.8800\ 1.9700\ 1.5000\ 1.2400\ 3.4400\ 2.7200\}$ The syndrome for child node (1, 3) may be obtained by adding correction terms $\delta H_{1,3}{}^T$ and $(\mu \cdot \delta) H_{1,3}{}^T$ to right four elements $\{1\ 0\ 1\ 0\}$ of the parent syndrome. In this case, $\delta=\beta_{0,3} \oplus \hat{\alpha}_{0,3}$, and $\mu$ is a vector with a value of 1 if $|\alpha_{0,4}'|>|\alpha_{0,4}''|$ and 0 otherwise. In this example, $\beta_{0,3}$ and $\hat{\alpha}_{0,3}$ are all zero vectors, $\delta$ becomes zero and the correction terms also become zero.

$$\sigma_{1,3} = \{1\ 0\ 1\ 0\} \qquad \text{Equation 26}$$

Since node (1, 3) does not satisfy a syndrome of 0, decoding proceeds down to node (2, 2), which is the next left child node. At node (2, 2), $\alpha_{2,2}$ and $\sigma_{2,2}$ are calculated in the same way as when the nodes goes down from node (0, 4) to node (0, 3). If the syndrome becomes zero, the nodes moves to right node (3, 2), and if the syndrome is not zero, the nodes goes down to node (4, 1). If the child node is to the left of the parent node, the syndrome of the parent node may be used as the syndrome of the child node. If the child node is to the right of the parent node, the syndrome of the child node may be easily calculated by adding the correction terms to the syndrome of the parent node. To complete decoding, above-described process may be repeated according to the tree structure.

Figure 9:
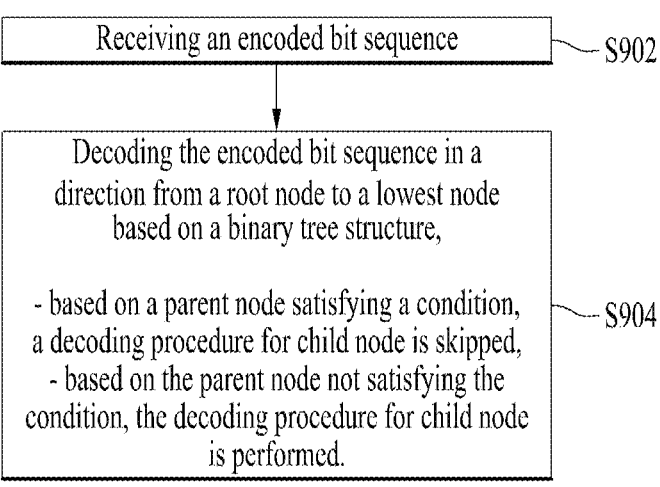
FIG. 9 illustrates a signal processing process according to an example of the present disclosure.

FIG. 9 illustrates a signal processing process according to an example of the present disclosure. Referring to FIG. 9, a receiving device may receive an encoded bit sequence (S902). Thereafter, the receiving device may decode the encoded bit sequence from the highest node to the lowest node based on a binary tree structure (S904). In this case, during the decoding step, based on that the syndrome of the parent node satisfies predetermined conditions, a decoding process for the child node may be omitted. Based on that the syndrome of the parent node does not satisfy the predetermined conditions, the decoding process for the child node may be performed. Here, the predetermined conditions includes that the syndrome of the parent nodes are all zeros. Specifically, the predetermined conditions may include the following.

1. The node is rate-1.
2. The node is rate-0.
3. The syndrome is satisfied.

Figure 10:
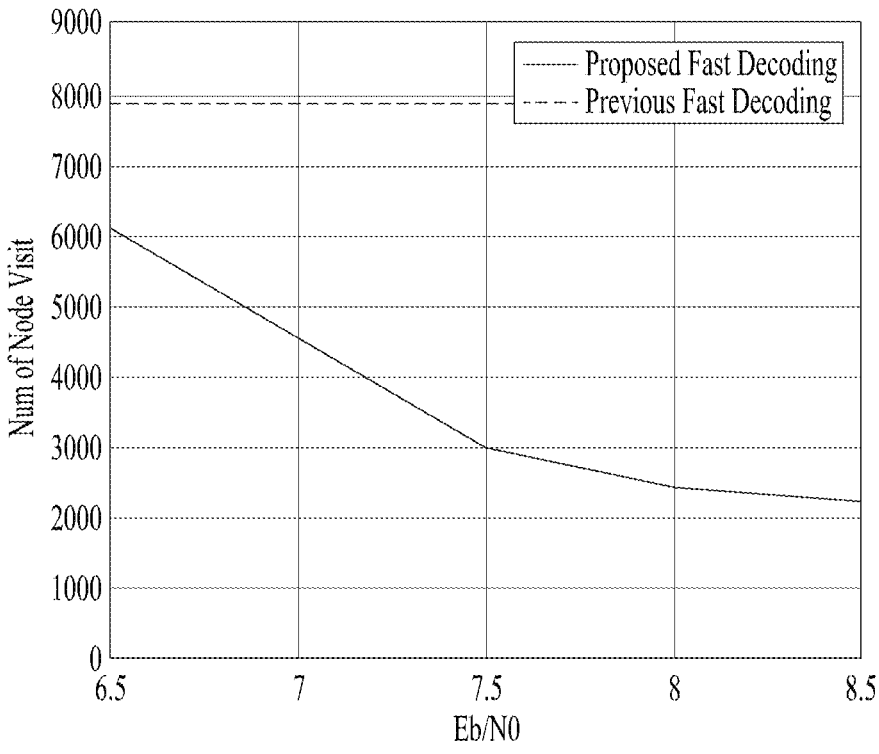
FIGS. 10 and 11 illustrate simulation results for polar codes according to the present disclosure.
Figure 11:
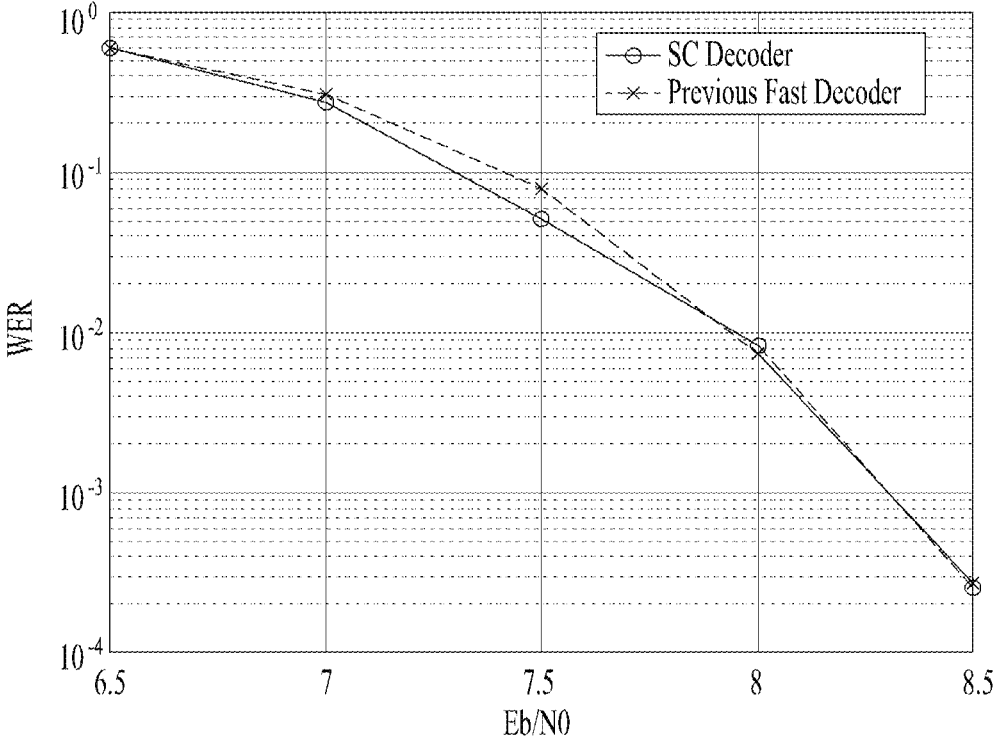

As described above, when the syndrome is calculated at every node and the syndrome satisfies zero, the complexity decreases by directly decoding the corresponding node, and the success frequency of high-speed decoding increases as $E_b/N_0$ of the channel increases. FIG. 10 illustrates the average number of nodes that need to be searched in a decoding tree according to $E_b/N_0$ of a channel in eBCH codes with a code length of 1024 and a message length of 513. As the number of search nodes decreases, the decoding complexity decreases. The complexity of the existing algorithm is affected only by the structure of the code rather than the quality of the channel, and thus there are no changes depending on $E_b/N_0$. However, the complexity of the proposed code decreases as the channel quality improves. If $E_b/N_0$ of the channel is not sufficiently large, it is possible to operate in the prior art. FIG. 11 illustrates a comparison between the error rate performance of the proposed algorithm and the SC decoder. The proposed algorithm achieves complexity gains without loss in error rate performance.

The polar code decoding method according to the present disclosure may be used in various communication environments. For instance, the polar code decoding method according to the present disclosure may be applied to wireless communications (e.g., 5G communications, 6G communications) to reduce reception complexity. Hereinafter, systems to which the present disclosure is applicable will be described.

Figure 12:
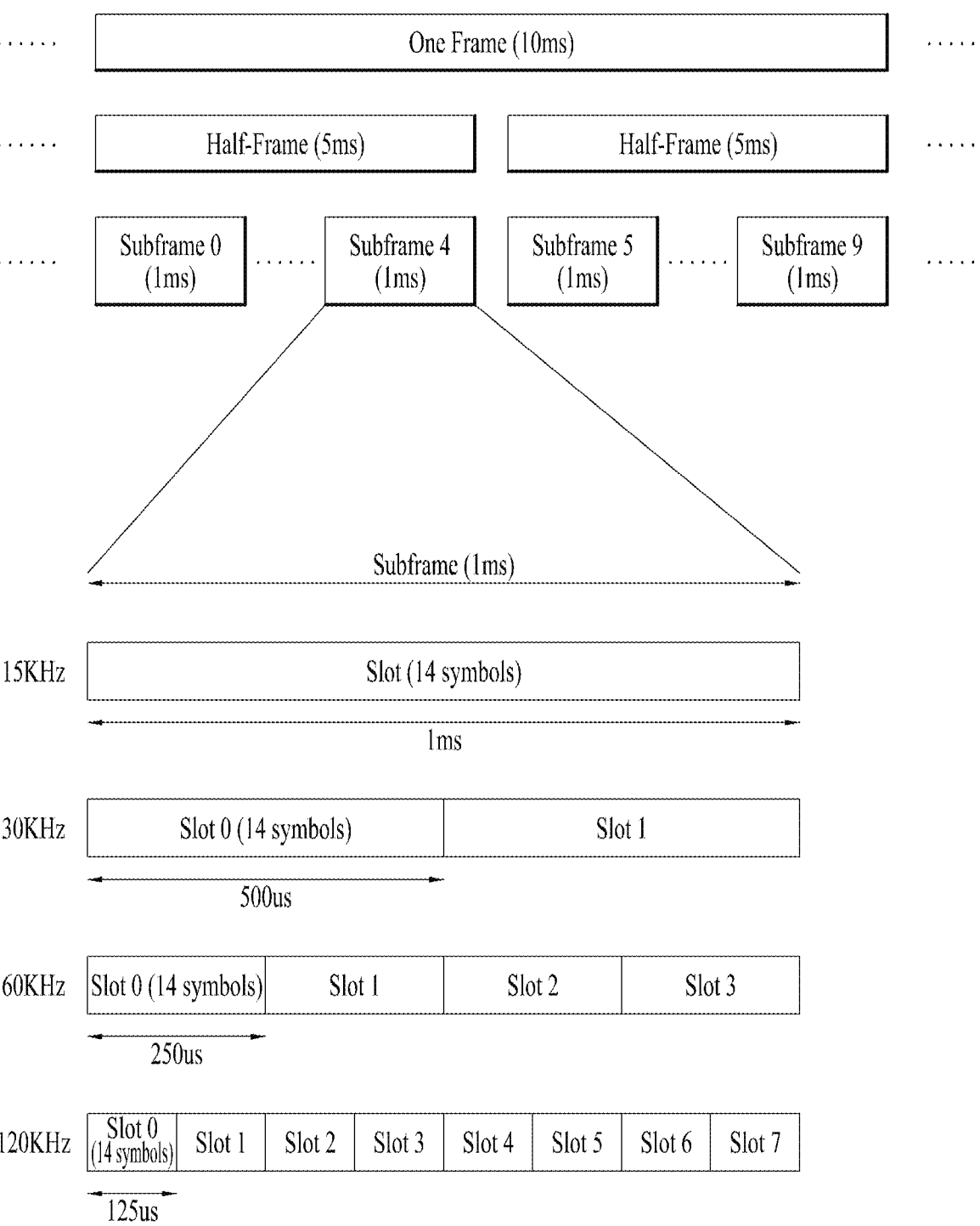
FIG. 12 illustrates an example of a frame structure.

FIG. 12 illustrates an example of a frame structure used in a 3GPP-based wireless communication system. The frame structure of FIG. 12 is purely exemplary and the number of subframes, the number of slots, and the number of symbols, in a frame, may be variously changed. In an NR system, different OFDM numerologies (e.g., subcarrier spacings (SCSs)) may be configured for multiple cells which are aggregated for one UE. Accordingly, the (absolute time) duration of a time resource including the same number of symbols (e.g., a subframe, a slot, or a transmission time interval (TTI)) may be differently configured for the aggregated cells. Here, the symbol may include an OFDM symbol (or cyclic prefix-OFDM (CP-OFDM) symbol) and an SC-FDMA symbol (or discrete Fourier transform-spread-OFDM (DFT-s-OFDM) symbol). In the present disclosure, the symbol, the OFDM-based symbol, the OFDM symbol, the CP-OFDM symbol, and the DFT-s-OFDM symbol are used interchangeably.

Referring to FIG. 12, in the NR system, UL and DL transmissions are organized into frames. Each frame has a duration of $T_f$=10 ms and is divided into two half-frames of 5 ms each. Each half-frame includes 5 subframes and a duration $T_{sf}$ of a single subframe is 1 ms. Subframes are further divided into slots and the number of slots in a subframe depends on a subcarrier spacing. Each slot includes 14 or 12 OFDM symbols based on a cyclic prefix. In a normal CP, each slot includes 14 OFDM symbols and, in an extended CP, each slot includes 12 OFDM symbols. The numerology depends on an exponentially scalable subcarrier spacing $\Delta f=2^u * 15$ kHz. The table below shows the number of OFDM symbols ($N^{slot}_{symb}$) per slot, the number of slots ($N^{frame,u}_{slot}$) per frame, and the number of slots ($N^{subframe,u}_{slot}$) per subframe.

TABLE 5

| u | $N^{slot}_{symb}$ | $N^{frame,u}_{slot}$ | $N^{subframe,u}_{slot}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

The table below shows the number of OFDM symbols per slot, the number of slots per frame, and the number of slots per subframe, according to the subcarrier spacing $\Delta f=2^u*15$ KHz.

TABLE 6

| u | $N^{slot}_{symb}$ | $N^{frame,u}_{slot}$ | $N^{subframe,u}_{slot}$ |
|---|---|---|---|
| 2 | 12 | 40 | 4 |

A slot includes a plurality of (e.g., 14 or 12) symbols in the time domain. For each numerology (e.g., SCS) and carrier, a resource grid of $N^{size,u}_{grid,x}*N^{RB}_{sc}$ subcarriers and/subframe,u $N^{subframe,u}_{symb}$ OFDM symbols is defined, starting at a common resource block (CRB) $N^{start,u}_{grid}$ indicated by higher layer signaling (e.g. RRC signaling), where $N^{size,u}_{grid,x}$ is the number of resource blocks (RBs) in the resource grid and the subscript x is DL for downlink and UL for uplink. $N^{RB}_{sc}$ is the number of subcarriers per RB. In the 3GPP based wireless communication system, $N^{RB}_{sc}$ is typically 12. One resource grid may be present for a given antenna port p, an SCS configuration u, and a transmission direction (DL or UL). The carrier bandwidth $N^{size,u}_{grid}$ for the SCS configuration u is provided by a higher layer parameter (e.g., RRC parameter). Each element in the resource grid for the antenna port p and SCS configuration u is referred to as a resource element (RE), and one complex symbol may be mapped to each RE. Each RE in the resource grid is uniquely identified by an index k in the frequency domain and an index 1 representing a symbol location relative to a reference point in the time domain. In the NR system, an RB is defined by 12 consecutive subcarriers in the frequency domain. In the NR system, RBs may be classified into CRBs and physical resource blocks (PRBs). CRBs are numbered from 0 upwards in the frequency domain for the SCS configuration u. The center of subcarrier 0 of CRB 0 for the SCS configuration u coincides with point A' which serves as a common reference point for RB grids. PRBs are defined within a bandwidth part (BWP) and numbered from 0 to $N^{size}_{BWP,i}-1$, where i is the number of the bandwidth part. The relationship between a CRB $n_{CRB}$ and a PRB $n_{PRB}$ in a bandwidth part i is defined as follows: $n_{PRB}=n_{CRB}+N^{size}_{BWP,i}$ where $N^{size}_{BWP,i}$ is a CRB where the bandwidth part starts relative to CRB 0. The BWP includes a plurality of consecutive RBs. A carrier may include a maximum of N (e.g., 5) BWPs.

In the NR system, polar codes are used for channel coding of data on a broadcast channel (BCH) transmitted/received over a physical broadcast channel (PBCH), DCI transmitted/received over a PDCCH, and UCI transmitted/received over a PUCCH or a PUSCH.

Figure 13:
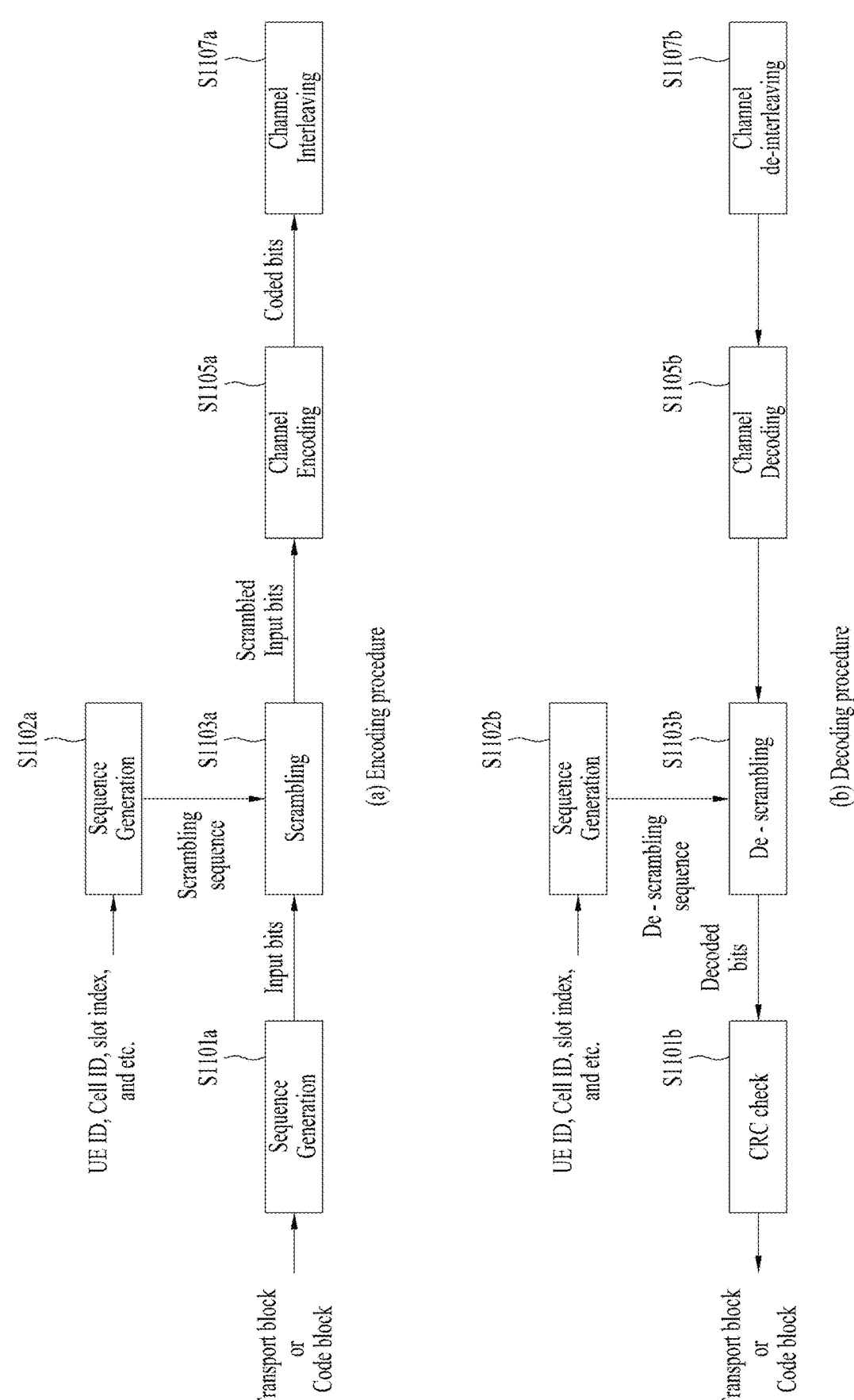
FIG. 13 illustrates encoding and decoding processes in conventional Long Term Evolution (LTE) system.

FIG. 13 illustrates encoding and decoding processes in the conventional LTE system. In particular, FIG. 13(a) illustrates an encoding process including scrambling, and FIG. 13(b) illustrates a decoding process including de-scrambling.

Referring to FIG. 13(a), a transmission device obtains input bits by adding a CRC code to a transport block or code block (S1101a) and then scrambles the input bits based on a scrambling sequence (S1103a). The transmission device generates coded bits by performing channel encoding on the scrambled input bits (S1105a) and then performs channel interleaving on the coded bits (S1107a). Referring to FIG. 13(b), a receiving device obtains coded bits by performing channel de-interleaving on received bits based on a channel interleaving pattern applied in the encoding process or a channel interleaving pattern related thereto (S1107b). The receiving device obtains scrambled bits by performing channel decoding on the coded bits (S1105b). The receiving device obtains a sequence of decoded bits (hereinafter referred to as a decoded bit sequence) by de-scrambling the scrambled bits based on a scrambling sequence (S1103b). The receiving device checks whether there is an error in the decoded bit sequence based on CRC bits in the decoded bit sequence (S1101b). If a CRC for the decoded bit sequence fails, the receiving device may determine that decoding of the received signal has failed. If the CRC for the decoded bit sequence is successful, the receiving device may determine that the decoding process is successful and then obtain a transport block or code block by removing the CRC code from the decoding bit sequence.

In FIG. 13(a), CRC generation (S1101a), sequence generation (S1102a), scrambling (S1103a), channel encoding (S1105a), and channel interleaving (S1107a) may be performed by a CRC code generator, sequence generator, scrambler, channel encoder, and channel interleaver, respectively. The CRC code generator, sequence generator, scrambler, channel encoder, and channel interleaver may be configured as part of a processor of the transmission device and operate under the control of the processor of the transmission device. In FIG. 13(b), CRC checking (S1101b), sequence generation (S1102b), de-scrambling (S1103b), channel decoding (S1105b), and channel interleaving (S1107b) may be performed by a CRC checker, sequence generator, de-scrambler, channel decoder, and channel interleaver, respectively. The CRC checker, sequence generator, de-scrambler, channel decoder, and channel interleaver may be configured as part of a processor of the receiving device and operate under the control of the processor of the receiving device. In the conventional LTE system, a scrambler generates an m-sequence based on a UE ID, cell ID, and/or slot index. Subsequently, the scrambler scrambles input bits input to the scrambler, which consist of information bits and CRC bits, based on the generated m-sequence. A de-scrambler generates an m-sequence based on a UE ID, cell ID, and/or slot index. Then, the de-scrambler de-scrambles input bits input the de-scrambler, which consist of information bits and CRC bits, based on the generated m-sequence.

Details of the encoding and decoding processes in the conventional LTE system may be found in 3GPP TS 36.211, 3GPP TS 36.212, 3GPP TS 36.331, and 3GPP TS 36.331. Similarly, details of the encoding and decoding processes in the NR system may be found in 3GPP TS 38.211, 3GPP TS 38.212, 3GPP TS 38.213, 3GPP TS 38.214, and 3GPP TS 38.331.

The methods proposed in the present disclosure may be used in various communication environments and is applicable to both wired and wireless communication technologies. The various details, functions, procedures, proposals, methods, and/or operational flowcharts described in this document may be applied to a variety of fields that require wireless communication/connections (e.g., 4G network (LTE network), 5G network (NR network), etc.) between devices.

Hereinafter, a description will be given in detail with reference to the drawings. In the following drawings/descriptions, the same reference numerals may denote the same or corresponding hardware blocks, software blocks, or functional blocks unless specified otherwise.

In the present disclosure, at least one memory (e.g., memory 104 or 204) may be configured store instructions or programs. The instructions or programs, when executed, may cause at least one processor operably connected to the at least one memory to perform operations according to embodiments or implementations of the present disclosure.

In the present disclosure, a computer-readable storage medium may be configured to store at least one instruction or computer program. The at least one instruction or computer program, when executed by at least one processor, may cause the at least one processor to perform operations according to embodiments or implementations of the present disclosure.

In the present disclosure, a computer program may include program code stored on at least one computer-readable (non-volatile) storage medium and, when executed, configured to perform operations according to some embodiments or implementations of the present disclosure. The computer program may be provided in the form of a computer program product. The computer program product may include at least one computer-readable (non-volatile) storage medium. The computer-readable storage medium may include the program code that, when executed, (causes at least one processor) to perform operations according to some embodiments or implementations of the present specification.

In the present disclosure, a processing device or apparatus may include at least one processor and at least one computer memory connectable to the at least one processor. The at least one computer memory may be configured to store instructions or programs. The instructions or programs, when executed, may cause the at least one processor operably connected to the at least one memory to perform operations according to embodiments or implementations of the present disclosure.

In the present disclosure, a communication device may include: at least one processor; and at least one computer memory operably connected to the at least one processor and configured to store instructions that, when executed, cause the at least one processor to perform operations according to example(s) of the present disclosure, which will be described.

Figure 14:
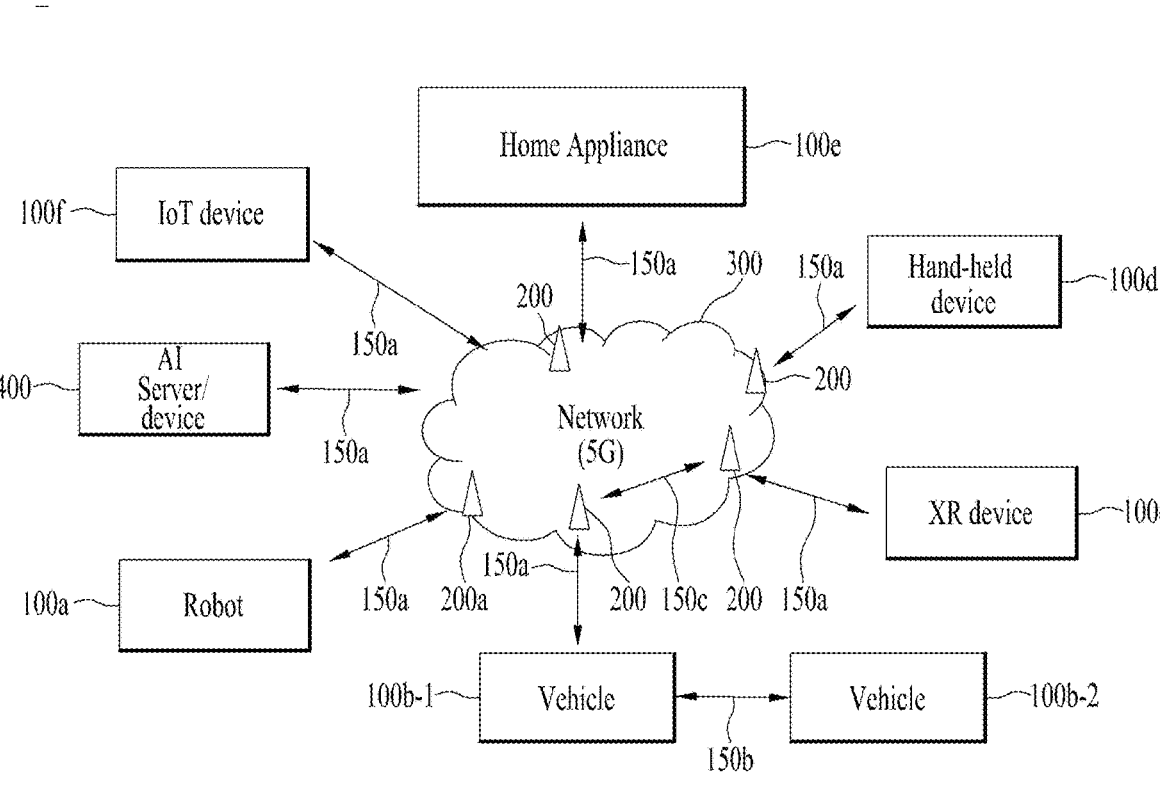

FIG. 14 illustrates a communication system applied to the present disclosure.

Referring to FIG. 14, a communication system I applied to the present disclosure includes wireless devices, Base Stations (BSs), and a network. Herein, the wireless devices represent devices performing communication using Radio Access Technology (RAT) (e.g., 5G New RAT (NR)) or Long-Term Evolution (LTE)) and may be referred to as communication/radio/5G devices. The wireless devices may include, without being limited to, a robot 100a, vehicles 100b-1 and 100b-2, an extended Reality (XR) device 100c, a hand-held device 100d, a home appliance 100e, an Internet of Things (IoT) device 100f, and an Artificial Intelligence (AI) device/server 400. For example, the vehicles may include a vehicle having a wireless communication function, an autonomous driving vehicle, and a vehicle capable of performing communication between vehicles. Herein, the vehicles may include an Unmanned Aerial Vehicle (UAV) (e.g., a drone). The XR device may include an Augmented Reality (AR)/Virtual Reality (VR)/Mixed Reality (MR) device and may be implemented in the form of a Head-Mounted Device (HMD), a Head-Up Display (HUD) mounted in a vehicle, a television, a smartphone, a computer, a wearable device, a home appliance device, a digital signage, a vehicle, a robot, etc. The hand-held device may include a smartphone, a smartpad, a wearable device (e.g., a smartwatch or a smartglasses), and a computer (e.g., a notebook). The home appliance may include a TV, a refrigerator, and a washing machine. The IoT device may include a sensor and a smartmeter. For example, the BSs and the network may be implemented as wireless devices and a specific wireless device 200a may operate as a BS/network node with respect to other wireless devices.

The wireless devices 100a to 100f may be connected to the network 300 via the BSs 200. An AI technology may be applied to the wireless devices 100a to 100f and the wireless devices 100a to 100f may be connected to the AI server 400 via the network 300. The network 300 may be configured using a 3G network, a 4G (e.g., LTE) network, or a 5G (e.g., NR) network. Although the wireless devices 100a to 100f may communicate with each other through the BSs 200/ network 300, the wireless devices 100a to 100f may perform direct communication (e.g., sidelink communication) with each other without passing through the BSs/network. For example, the vehicles 100b-1 and 100b-2 may perform direct communication (e.g., Vehicle-to-Vehicle (V2V)/Vehicle-to-everything (V2X) communication). The IoT device (e.g., a sensor) may perform direct communication with other IoT devices (e.g., sensors) or other wireless devices 100a to 100f.

Wireless communication/connections 150a, 150b, or 150c may be established between the wireless devices 100a to 100f/BS 200, or BS 200/BS 200. Herein, the wireless communication/connections may be established through various RATs (e.g., 5G NR) such as uplink/downlink communication 150a, sidelink communication 150b (or, D2D communication), or inter BS communication (e.g., relay, Integrated Access Backhaul (IAB)). The wireless devices and the BSs/the wireless devices may transmit/receive radio signals to/from each other through the wireless communication/connections 150a and 150b. For example, the wireless communication/connections 150a and 150b may transmit/receive signals through various physical channels. To this end, at least a part of various configuration information configuring processes, various signal processing processes (e.g., channel encoding/decoding, modulation/demodulation, and resource mapping/demapping), and resource allocating processes, for transmitting/receiving radio signals, may be performed based on the various proposals of the present disclosure FIG. 15 illustrates a wireless device applicable to the present disclosure.

Figure 15:
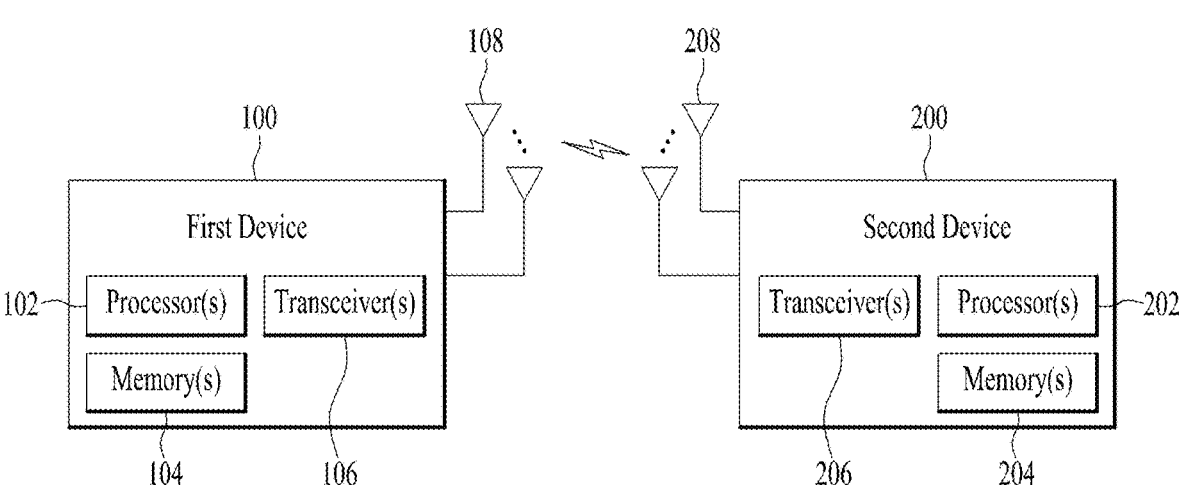

Referring to FIG. 15, a first wireless device 100 and a second wireless device 200 may transmit radio signals through a variety of RATs (e.g., LTE and NR). Herein, {the first wireless device 100 and the second wireless device 200} may correspond to {the wireless device 100x and the BS 200} and/or {the wireless device 100x and the wireless device 100x} of FIG. 24.

The first wireless device 100 may include one or more processors 102 and one or more memories 104 and additionally further include one or more transceivers 106 and/or one or more antennas 108. The processor(s) 102 may control the memory(s) 104 and/or the transceiver(s) 106 and may be configured to implement the descriptions, functions, procedures, proposals, methods, and/or operational flowcharts disclosed in this document. For example, the processor(s) 102 may process information within the memory(s) 104 to generate first information/signals and then transmit radio signals including the first information/signals through the transceiver(s) 106. The processor(s) 102 may receive radio signals including second information/signals through the transceiver 106 and then store information acquired by processing the second information/signals in the memory(s) 104. The memory(s) 104 may be connected to the processor(s) 102 and may store a variety of information related to operations of the processor(s) 102. For example, the memory(s) 104 may store software code including commands for performing a part or the entirety of processes controlled by the processor(s) 102 or for performing the descriptions, functions, procedures, proposals, methods, and/or operational flowcharts disclosed in this document. Herein, the processor(s) 102 and the memory(s) 104 may be a part of a communication modem/circuit/chip designed to implement RAT (e.g., LTE or NR). The transceiver(s) 106 may be connected to the processor(s) 102 and transmit and/or receive radio signals through one or more antennas 108. Each of the transceiver(s) 106 may include a transmitter and/or a receiver. The transceiver(s) 106 may be interchangeably used with Radio Frequency (RF) unit(s). In the present disclosure, the wireless device may represent a communication modem/circuit/chip.

The second wireless device 200 may include one or more processors 202 and one or more memories 204 and additionally further include one or more transceivers 206 and/or one or more antennas 208. The processor(s) 202 may control the memory(s) 204 and/or the transceiver(s) 206 and may be configured to implement the descriptions, functions, procedures, proposals, methods, and/or operational flowcharts disclosed in this document. For example, the processor(s) 202 may process information within the memory(s) 204 to generate third information/signals and then transmit radio signals including the third information/signals through the transceiver(s) 206. The processor(s) 202 may receive radio signals including fourth information/signals through the transceiver(s) 106 and then store information acquired by processing the fourth information/signals in the memory(s) 204. The memory(s) 204 may be connected to the processor(s) 202 and may store a variety of information related to operations of the processor(s) 202. For example, the memory(s) 204 may store software code including commands for performing a part or the entirety of processes controlled by the processor(s) 202 or for performing the descriptions, functions, procedures, proposals, methods, and/or operational flowcharts disclosed in this document. Herein, the processor(s) 202 and the memory(s) 204 may be a part of a communication modem/circuit/chip designed to implement RAT (e.g., LTE or NR). The transceiver(s) 206 may be connected to the processor(s) 202 and transmit and/or receive radio signals through one or more antennas 208. Each of the transceiver(s) 206 may include a transmitter and/or a receiver. The transceiver(s) 206 may be interchangeably used with RF unit(s). In the present disclosure, the wireless device may represent a communication modem/circuit/chip.

Hereinafter, hardware elements of the wireless devices 100 and 200 will be described more specifically. One or more protocol layers may be implemented by, without being limited to, one or more processors 102 and 202. For example, the one or more processors 102 and 202 may implement one or more layers (e.g., functional layers such as PHY, MAC, RLC, PDCP, RRC, and SDAP). The one or more processors 102 and 202 may generate one or more Protocol Data Units (PDUs) and/or one or more Service Data Unit (SDUs) according to the descriptions, functions, procedures, proposals, methods, and/or operational flowcharts disclosed in this document. The one or more processors 102 and 202 may generate messages, control information, data, or information according to the descriptions, functions, procedures, proposals, methods, and/or operational flowcharts disclosed in this document. The one or more processors 102 and 202 may generate signals (e.g., baseband signals) including PDUs, SDUs, messages, control information, data, or information according to the descriptions, functions, procedures, proposals, methods, and/or operational flowcharts disclosed in this document and provide the generated signals to the one or more transceivers 106 and 206. The one or more processors 102 and 202 may receive the signals (e.g., baseband signals) from the one or more transceivers 106 and 206 and acquire the PDUs, SDUs, messages, control information, data, or information according to the descriptions, functions, procedures, proposals, methods, and/or operational flowcharts disclosed in this document.

The one or more processors 102 and 202 may be referred to as controllers, microcontrollers, microprocessors, or microcomputers. The one or more processors 102 and 202 may be implemented by hardware, firmware, software, or a combination thereof. As an example, one or more Application Specific Integrated Circuits (ASICs), one or more Digital Signal Processors (DSPs), one or more Digital Signal Processing Devices (DSPDs), one or more Programmable Logic Devices (PLDs), or one or more Field Programmable Gate Arrays (FPGAs) may be included in the one or more processors 102 and 202. The descriptions, functions, procedures, proposals, methods, and/or operational flowcharts disclosed in this document may be implemented using firmware or software and the firmware or software may be configured to include the modules, procedures, or functions. Firmware or software configured to perform the descriptions, functions, procedures, proposals, methods, and/or operational flowcharts disclosed in this document may be included in the one or more processors 102 and 202 or stored in the one or more memories 104 and 204 so as to be driven by the one or more processors 102 and 202. The descriptions, functions, procedures, proposals, methods, and/or operational flowcharts disclosed in this document may be implemented using firmware or software in the form of code, commands, and/or a set of commands.

The one or more memories 104 and 204 may be connected to the one or more processors 102 and 202 and store various types of data, signals, messages, information, programs, code, instructions, and/or commands. The one or more memories 104 and 204 may be configured by Read-Only Memories (ROMs). Random Access Memories (RAMs). Electrically Erasable Programmable Read-Only Memories (EPROMs), flash memories, hard drives, registers, cash memories, computer-readable storage media, and/or combinations thereof. The one or more memories 104 and 204 may be located at the interior and/or exterior of the one or more processors 102 and 202. The one or more memories 104 and 204 may be connected to the one or more processors 102 and 202 through various technologies such as wired or wireless connection.

The one or more transceivers 106 and 206 may transmit user data, control information, and/or radio signals/channels, mentioned in the methods and/or operational flowcharts of this document, to one or more other devices. The one or more transceivers 106 and 206 may receive user data, control information, and/or radio signals/channels, mentioned in the descriptions, functions, procedures, proposals, methods, and/or operational flowcharts disclosed in this document, from one or more other devices. For example, the one or more transceivers 106 and 206 may be connected to the one or more processors 102 and 202 and transmit and receive radio signals. For example, the one or more processors 102 and 202 may perform control so that the one or more transceivers 106 and 206 may transmit user data, control information, or radio signals to one or more other devices. The one or more processors 102 and 202 may perform control so that the one or more transceivers 106 and 206 may receive user data, control information, or radio signals from one or more other devices. The one or more transceivers 106 and 206 may be connected to the one or more antennas 108 and 208 and the one or more transceivers 106 and 206 may be configured to transmit and receive user data, control information, and/or radio signals/channels, mentioned in the descriptions, functions, procedures, proposals, methods, and/or operational flowcharts disclosed in this document, through the one or more antennas 108 and 208. In this document, the one or more antennas may be a plurality of physical antennas or a plurality of logical antennas (e.g., antenna ports). The one or more transceivers 106 and 206 may convert received radio signals/channels etc. from RF band signals into baseband signals in order to process received user data, control information, radio signals/channels, etc. using the one or more processors 102 and 202. The one or more transceivers 106 and 206 may convert the user data, control information, radio signals/channels, etc. processed using the one or more processors 102 and 202 from the base band signals into the RF band signals. To this end, the one or more transceivers 106 and 206 may include (analog) oscillators and/or filters.

FIG. 16 illustrates another example of a wireless device applied to the present disclosure. The wireless device may be implemented in various forms according to a use-case/service (refer to FIG. 25)

Referring to FIG. 16, wireless devices 100 and 200 may correspond to the wireless devices 100 and 200 of FIG. 15 and may be configured by various elements, components, units/portions, and/or modules. For example, each of the wireless devices 100 and 200 may include a communication unit 110, a control unit 120, a memory unit 130, and additional components 140. The communication unit may include a communication circuit 112 and transceiver(s) 114. For example, the communication circuit 112 may include the one or more processors 102 and 202 and/or the one or more memories 104 and 204 of FIG. 14. For example, the transceiver(s) 114 may include the one or more transceivers 106 and 206 and/or the one or more antennas 108 and 208 of FIG. 14. The control unit 120 is electrically connected to the communication unit 110, the memory 130, and the additional components 140 and controls overall operation of the wireless devices. For example, the control unit 120 may control an electric/mechanical the wireless device based operation of on programs/code/commands/information stored in the memory unit 130. The control unit 120 may transmit the information stored in the memory unit 130 to the exterior (e.g., other communication devices) via the communication unit 110 through a wireless/wired interface or store, in the memory unit 130, information received through the wireless/wired interface from the exterior (e.g., other communication devices) via the communication unit 110.

The additional components 140 may be variously configured according to types of wireless devices. For example, the additional components 140 may include at least one of a power unit/battery, input/output (I/O) unit, a driving unit, and a computing unit. The wireless device may be implemented in the form of, without being limited to, the robot (100a of FIG. 14), the vehicles (100b-1 and 100b-2 of FIG. 14), the XR device (100c of FIG. 14), the hand-held device (100d of FIG. 14), the home appliance (100e of FIG. 14), the IoT device (100f of FIG. 14), a digital broadcast terminal, a hologram device, a public safety device, an MTC device, a medicine device, a fintech device (or a finance device), a security device, a climate/environment device, the AI server/device (400 of FIG. 14), the BSs (200 of FIG. 14), a network node, etc. The wireless device may be used in a mobile or fixed place according to a use-example/service.

In FIG. 16, the entirety of the various elements, components, units/portions, and/or modules in the wireless devices 100 and 200 may be connected to each other through a wired interface or at least a part thereof may be wirelessly connected through the communication unit 110. For example, in each of the wireless devices 100 and 200, the control unit 120 and the communication unit 110 may be connected by wire and the control unit 120 and first units (e.g., 130 and 140) may be wirelessly connected through the communication unit 110. Each element, component, unit/portion, and/or module within the wireless devices 100 and 200 may further include one or more elements. For example, the control unit 120 may be configured by a set of one or more processors. As an example, the control unit 120 may be configured by a set of a communication control processor, an application processor, an Electronic Control Unit (ECU), a graphical processing unit, and a memory control processor. As another example, the memory 130 may be configured by a Random Access Memory (RAM), a Dynamic RAM (DRAM), a Read Only Memory (ROM)), a flash memory, a volatile memory, a non-volatile memory, and/or a combination thereof.

Figure 17:
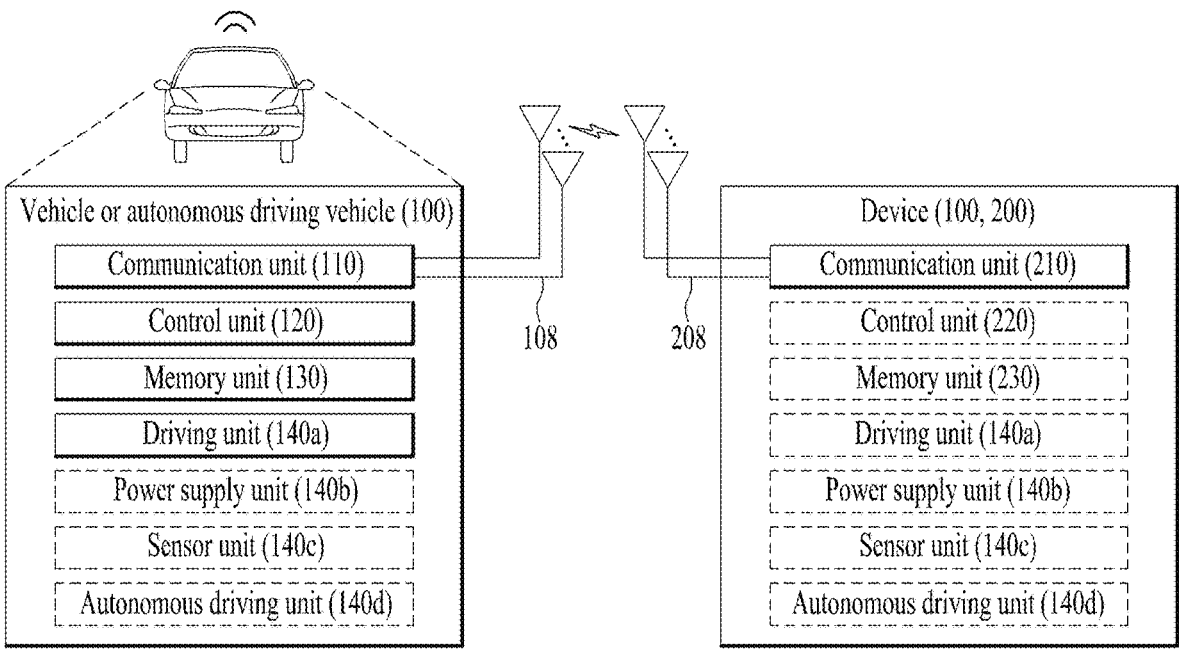

FIG. 17 illustrates a vehicle or an autonomous driving vehicle applied to the present disclosure. The vehicle or autonomous driving vehicle may be implemented by a mobile robot, a car, a train, a manned/unmanned Aerial Vehicle (AV), a ship, etc.

Referring to FIG. 17, a vehicle or autonomous driving vehicle 100 may include an antenna unit 108, a communication unit 110, a control unit 120, a driving unit 140a, a power supply unit 140b, a sensor unit 140c, and an autonomous driving unit 140d. The antenna unit 108 may be configured as a part of the communication unit 110. The blocks 110/130/140a to 140d correspond to the blocks 110/130/140 of FIG. 16, respectively.

The communication unit 110 may transmit and receive signals (e.g., data and control signals) to and from external devices such as other vehicles, BSs (e.g., gNBs and road side units), and servers. The control unit 120 may perform various operations by controlling elements of the vehicle or the autonomous driving vehicle 100. The control unit 120 may include an Electronic Control Unit (ECU). Also, the driving unit 140a may cause the vehicle or the autonomous driving vehicle 100 to drive on a road. The driving unit 140a may include an engine, a motor, a powertrain, a wheel, a brake, a steering device, etc. The power supply unit 140b may supply power to the vehicle or the autonomous driving vehicle 100 and include a wired/wireless charging circuit, a battery, etc. The sensor unit 140c may acquire a vehicle state, ambient environment information, user information, etc. The sensor unit 140c may include an Inertial Measurement Unit (IMU) sensor, a collision sensor, a wheel sensor, a speed sensor, a slope sensor, a weight sensor, a heading sensor, a position module, a vehicle forward/backward sensor, a battery sensor, a fuel sensor, a tire sensor, a steering sensor, a temperature sensor, a humidity sensor, an ultrasonic sensor, an illumination sensor, a pedal position sensor, etc. The autonomous driving unit 140d may implement technology for maintaining a lane on which a vehicle is driving, technology for automatically adjusting speed, such as adaptive cruise control, technology for autonomously driving along a determined path, technology for driving by automatically setting a path if a destination is set, and the like.

For example, the communication unit 110 may receive map data, traffic information data, etc. from an external server. The autonomous driving unit 140d may generate an autonomous driving path and a driving plan from the acquired data. The control unit 120 may control the driving unit 140a such that the vehicle or the autonomous driving vehicle 100 may move along the autonomous driving path according to the driving plan (e.g., speed/direction control). In the middle of autonomous driving, the communication unit 110 may aperiodically/periodically acquire recent traffic information data from the external server and acquire surrounding traffic information data from neighboring vehicles. In the middle of autonomous driving, the sensor unit 140c may obtain a vehicle state and/or surrounding environment information. The autonomous driving unit 140d may update the autonomous driving path and the driving plan based on the newly acquired data/information. The communication unit 110 may transfer information about a vehicle position, the autonomous driving path, and/or the driving plan to the external server. The external server may predict traffic information data using AI technology, etc., based on the information collected from vehicles or autonomous driving vehicles and provide the predicted traffic information data to the vehicles or the autonomous driving vehicles.

The embodiments described above are those in which components and features of the present disclosure are combined in a predetermined form. Each component or feature should be considered optional unless explicitly stated otherwise. Each component or feature may be implemented in a form that is not combined with other components or features. In addition, it is also possible to constitute an embodiment of the present disclosure by combining some components and/or features. The order of operations described in the embodiments of the present disclosure may be changed. Some configurations or features of one embodiment may be included in other embodiments, or may be replaced with corresponding configurations or features of other embodiments. It is obvious that the embodiments may be configured by combining claims that do not have an explicit citation relationship in the claims or may be included as new claims by amendment after filing.

As described before, a detailed description has been given of preferred embodiments of the present disclosure so that those skilled in the art may implement and perform the present disclosure. While reference has been made above to the preferred embodiments of the present disclosure, those skilled in the art will understand that various modifications and alterations may be made to the present disclosure within the scope of the present disclosure. For example, those skilled in the art may use the components described in the foregoing embodiments in combination. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

INDUSTRIAL APPLICABILITY

The present disclosure may be used in a terminal, base station, or other equipment of a wireless mobile communication system.

What is claimed is:

1. A method by a receiving device comprising:

receiving a downlink channel, wherein the downlink channel includes a bit sequence encoded based on a channel coding and interleaving;

performing decoding the bit sequence, and obtaining a transport block based on the bit sequence that has been decoded, wherein the channel coding is a polar coding, wherein the decoding of the bit sequence includes performing error detection on the bit sequence through a cyclic redundancy check (CRC) related to the bit sequence, wherein, based on the channel coding being the polar coding, the decoding of the bit sequence is performed in a direction from a highest node to a lowest node based on a binary tree structure, wherein based on a syndrome of a parent node satisfying a predetermined condition, decoding of a child node is omitted in the decoding, and wherein based on the syndrome of the parent node not satisfying the predetermined condition, the child node is decoded.

2. The method of claim 1, wherein the predetermined condition includes that the syndrome of the parent node is all zeros.

3. The method of claim 2, wherein the syndrome of the parent node is determined based on a following equation:

$$\sigma = \hat{\alpha} F^{\otimes n} V^T,$$

where $\sigma$ represents the syndrome, $\hat{\alpha}$ represents a soft decision result, $F^{\otimes n}$ represents a polar code matrix with a dimension of N*N, V represents a constraint matrix satisfying $Z*V^T=0$, and Z represents a pre-coding matrix with a dimension of k*N.

4. The method of claim 3, wherein V has a following structure:

$$V = \begin{bmatrix} V_1 & 0 \\ V_3 & V_2 \end{bmatrix},$$

where V1 is a constraint matrix with a dimension of nm*N/2, each of V2 and V3 is a constraint matrix with a dimension of $n_{f2}*N/2$, and $n_{fi}$ represents a sum of frozen and parity lengths of child node i.

5. The method of claim 4, wherein a syndrome of child node i is determined based on a following equation:

$$\sigma_1 = \hat{\alpha}_1 F^{\otimes n-1} V_1^T$$

$$\sigma_2 = \hat{\alpha}_2 F^{\otimes n-1} V_2^T \oplus \beta_1 F^{\otimes n-1} V_3^T,$$

where i is 0 or 1, $\sigma_i$ is the syndrome of child node i, $F^{\otimes n-1}$ is a polar code matrix with a dimension of N/2*N/2, and $\beta 1$ is a bit decision value of child node 1.

6. A receiving device used in a communication system, the receiving device comprising:

at least one radio frequency (RF) unit;

at least one processor; and at least one non-transitory computer memory operably connected to the at least one processor and including instructions that, when executed, cause the at least one processor to perform operations comprising:

receiving a downlink channel, wherein the downlink channel includes a bit sequence encoded based on a channel coding and interleaving;

performing decoding the encoded bit sequence, and obtaining a transport block based on the bit sequence that has been decoded, wherein the channel coding is a polar coding, wherein the decoding of the bit sequence includes performing error detection on the bit sequence through a cyclic redundancy check (CRC) related to the bit sequence, wherein, based on the channel coding being the polar coding, the decoding of the bit sequence is performed in a direction from a highest node to a lowest node based on a binary tree structure, wherein based on a syndrome of a parent node satisfying a predetermined condition, decoding of a child node is omitted in the decoding, and wherein based on the syndrome of the parent node not satisfying the predetermined condition, the child node is decoded.

7. The receiving device of claim 6, wherein the predetermined condition includes that the syndrome of the parent node is all zeros.

8. The receiving device of claim 7, wherein the syndrome of the parent node is determined based on a following equation:

$$\sigma = \hat{\alpha} F^{\otimes n} V^T,$$

where $\sigma$ represents the syndrome, $\hat{\alpha}$ represents a soft decision result, $F^{\otimes n}$ represents a polar code matrix with a dimension of N*N, V represents a constraint matrix satisfying $Z*V^T=0$, and Z represents a pre-coding matrix with a dimension of k*N.

9. The receiving device of claim 8, wherein V has a following structure:

$$V = \begin{bmatrix} V_1 & 0 \\ V_3 & V_2 \end{bmatrix},$$

where V1 is a constraint matrix with a dimension of $n_{f1}*N/2$, each of V2 and V3 is a constraint matrix with a dimension of $n_{f2}*N/2$, and $n_{fi}$ represents a sum of frozen and parity lengths of child node i.

10. The receiving device of claim 9, wherein a syndrome of child node i is determined based on a following equation:

$$\sigma_1 = \hat{\alpha}_1 F^{\otimes n-1} V_1^T$$

$$\sigma_2 = \hat{\alpha}_2 F^{\otimes n-1} V_2^T \oplus \beta_1 F^{\otimes n-1} V_3^T,$$

where i is 0 or 1, $\sigma_i$ is the syndrome of child node i, $F^{\otimes n-1}$ is a polar code matrix with a dimension of N/2*N/2, and $\beta 1$ is a bit decision value of child node 1.

11. A non-transitory computer-readable storage medium comprising at least one computer program that, when executed, causes at least one processor to perform operations comprising:

receiving a downlink channel, wherein the downlink channel includes a bit sequence encoded based on a channel coding and interleaving;

performing decoding the bit sequence, and obtaining a transport block based on the bit sequence that has been decoded, wherein the channel coding is a polar coding, wherein the decoding of the bit sequence includes performing error detection on the bit sequence through a cyclic redundancy check (CRC) related to the bit sequence, wherein, based on the channel coding being the polar coding, the decoding of the bit sequence is performed in a direction, wherein based on a syndrome of a parent node satisfying a predetermined condition, decoding of a child node is omitted in the decoding, and wherein based on the syndrome of the parent node not satisfying the predetermined condition, the child node is decoded.

12. The computer-readable storage medium of claim 11, wherein the predetermined condition includes that the syndrome of the parent node is all zeros.

13. The computer-readable storage medium of claim 12, wherein the syndrome of the parent node is determined based on a following equation:

$$\sigma = \hat{\alpha} F^{\otimes n} V^T,$$

where $\sigma$ represents the syndrome, $\hat{\alpha}$ represents a soft decision result, $F^{\otimes n}$ represents a polar code matrix with a dimension of N*N, V represents a constraint matrix satisfying $Z*V^T=0$, and Z represents a pre-coding matrix with a dimension of k*N.

14. The computer-readable storage medium of claim 13, wherein V has a following structure:

$$V = \begin{bmatrix} V_1 & 0 \\ V_3 & V_2 \end{bmatrix},$$

where V1 is a constraint matrix with a dimension of $n_{f1}*N/2$, each of V2 and V3 is a constraint matrix with a dimension of $n_{f2}*N/2$, and $n_{fi}$ represents a sum of frozen and parity lengths of child node i.

15. The computer-readable storage medium of claim 14, wherein a syndrome of child node i is determined based on a following equation:

$$\sigma_1 = \hat{\alpha}_1 F^{\otimes n-1} V_1^T$$

$$\sigma_2 = \hat{\alpha}_2 F^{\otimes n-1} V_2^T \oplus \beta_1 F^{\otimes n-1} V_3^T,$$

where i is 0 or 1, $\sigma_i$ is the syndrome of child node i, $F^{\otimes n-1}$ is a polar code matrix with a dimension of N/2*N/2, and $\beta 1$ is a bit decision value of child node 1.

* * * * *